(12) United States Patent
Ueno

(10) Patent No.: US 8,154,352 B2
(45) Date of Patent: Apr. 10, 2012

(54) OSCILLATING CIRCUIT

(75) Inventor: Yosuke Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 1035 days.

(21) Appl. No.: 11/723,819

(22) Filed: Mar. 22, 2007

(65) Prior Publication Data

US 2007/0241826 A1 Oct. 18, 2007

(30) Foreign Application Priority Data

Mar. 31, 2006 (JP) ................. 2006-098667

(51) Int. Cl.
*H03K 3/03* (2006.01)
*H03L 5/02* (2006.01)
(52) U.S. Cl. ................. 331/57; 331/45; 331/185
(58) Field of Classification Search ............... 331/45, 331/57, 185
See application file for complete search history.

(56) References Cited

U.S. PATENT DOCUMENTS

| 7,321,269 B2 * | 1/2008 | Drake et al. .............. 331/57 |
| 7,338,817 B2 * | 3/2008 | Liu et al. .............. 438/10 |
| 2004/0032300 A1 | 2/2004 | Joordens et al. | |

FOREIGN PATENT DOCUMENTS

| JP | 63-185121 A | 7/1988 |
| JP | 64-074819 | 3/1989 |
| JP | 03-101410 A | 4/1991 |
| JP | 06-188634 A | 7/1994 |
| JP | 2005-094754 A | 4/2005 |
| JP | 2005-536923 A | 12/2005 |

OTHER PUBLICATIONS

Sun et al. "A 1.25GHz 0.35-um Monolithic CMOS PLL based on a Multiphase Ring Oscillator", IEEE Journal of Solid-State Circuits, vol. 36, No. 6, Jun. 2001, pp. 910-916.*
A. Hajimiri et al., "Jitter and Phase Noise in Ring Oscillators," IEEE Journal of Solid-State Circuits, vol. 34, No. 6, Jun. 1999.
T. H. Lee, "Oscillator Phase Noise: A Tutorial," IEEE Journal of Solid-State Circuits, vol. 35, No. 3, Mar. 2000.
A. Rezayee, A Three-Stage Coupled Ring Oscillator with Quadrature Outputs, Dept. of Electrical and Computer Engineering, university of Toronto, Toronto, Ontario, Canada, IEEE 2001.

(Continued)

*Primary Examiner* — Levi Gannon
(74) *Attorney, Agent, or Firm* — Rader, Fishman & Grauer PLLC

(57) ABSTRACT

An oscillating circuit includes N nodes outputting oscillating signals, a main loop circuit including N inverting circuits, and a plurality of auxiliary loop circuits. Each inverting circuit in the auxiliary loop circuits is connected in parallel with even numbers of inverting circuits cascaded in the main loop circuit. The circuits for feeding back signals from outputs to inputs of the respective inverters of the main loop circuit have circuit configurations equivalent to each other. Each inverting circuit in the main loop circuit and the auxiliary loop circuits drives an output line such that a phase of an output signal is inverted with respect to a phase of an input signal and has driving power that becomes lower when the phases of the output signal and the input signal are inverted with respect to each other than when the output signal and the input signal are in phase with each other.

6 Claims, 17 Drawing Sheets

OTHER PUBLICATIONS

A. Rezayee et al., "A Coupled Two-Stage Ring Oscillator," IEEE, Dept. of Electrical and Computer Engineering, University of Toronto, Toronto, Ontario, Canada, 2001.

W. Shing Tak Yan et al., "A 900-MHz CMOS Low-Phase-Noise Voltage-Controlled Ring Oscillator," IEEE Transactions on Circuits and Systems—II: Analog and Digital Signal Processing, vol. 48, No. 2, Feb. 2001.

D. A. Badillo et al., "A Novel Low Phase Noise 1.8v 900MHz CMOS Voltage Controlled Ring Oscillator," IEEE, Arizona State University, Tempe Arizona 2003.

D. A. Badillo et al., "Comparison of Contemporary CMOS Ring Oscillators," IEEE, Arizona State University, Tempe, Arizona 2004.

L. Dai et al., "A Low-Phase-Noise CMOS Ring Oscillator with Differential Control and Quadrature Outputs," IEEE, University of Minnesota, Minneapolis, MN, 2001.

Yun-Hsueh Chuang, et al., "A Low Voltage 900MHz Voltage Controlled Ring Oscillator With Wide Tuning Range," The 2004 IEEE Asia-Pacific Conference on Circuits and Systems, Dec. 6-9, 2004.

D. A. Badillo et al., "A Low Phase Noise 2.0V 900MHz CMOS Voltage Controlled Ring Oscillator," IEEE, Arizona State University, Tempe Arizona, 2004.

Japanese Office Action issued May 15, 2011 for corresponding Japanese Application No. 2006-098667.

* cited by examiner

FIG. 22A
BACKGROUND ART
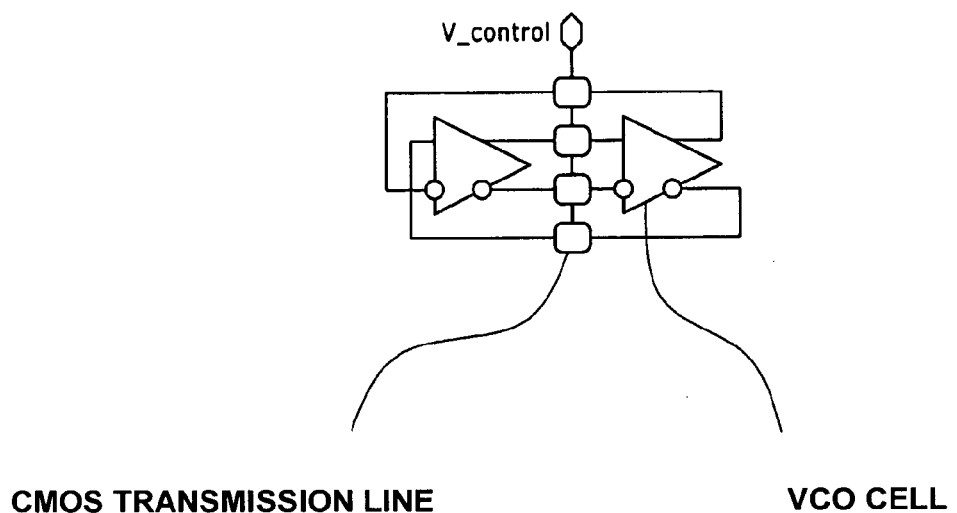
CMOS TRANSMISSION LINE
VCO CELL
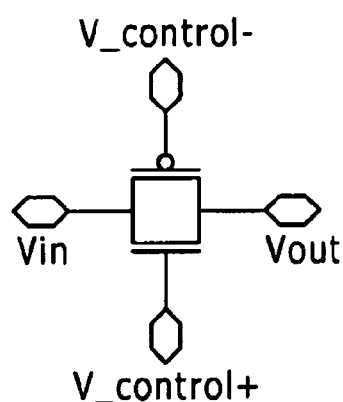
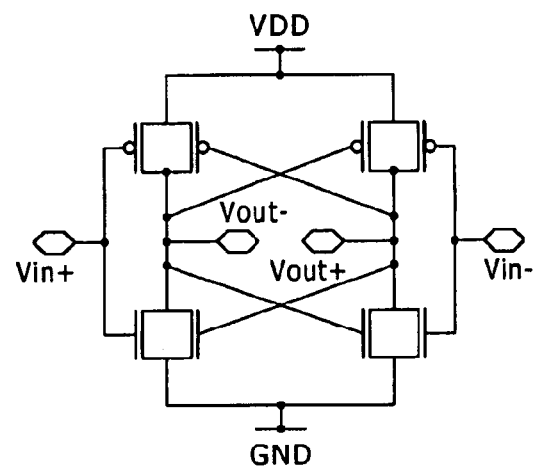
FIG. 22B
BACKGROUND ART
FIG. 22C
BACKGROUND ART

OSCILLATING CIRCUIT

CROSS REFERENCES TO RELATED APPLICATIONS

The present invention contains subject matter related to Japanese Patent Application JP 2006-098667 filed with the Japan Patent Office on Mar. 31, 2006, the entire contents of which being incorporated herein by reference.

BACKGROUND OF THE INVENTION

1. Field of the Invention

The present invention relates to an oscillating circuit that generates oscillating signals using inverting circuits cascaded in the form of a ring, and particularly to an oscillating circuit that can control oscillation frequency.

2. Description of the Related Art

PLL (phase-locked loop) circuits are widely used to generate an oscillating signal with a high spectral accuracy or generate a clock signal locked in frequency and phase to a data signal. Examples of applications of the PLL circuit include radio communications of portable telephones and the like, serial communications through various cables, and reproducing systems (read channels) for reproducing digital recorded data on disk media.

A first performance requirement for the PLL circuit is the precision of an output signal. Because the precision of the output signal is decreased by thermal noise and various noises inherent in elements, this decrease is desired to be prevented. In general, jitter performance and phase noise are widely used as an index for evaluating the precision.

A PLL circuit includes a voltage controlled oscillating circuit (voltage controlled oscillator, which will hereinafter be described as a VCO). In many cases, this VCO is a main factor in jitter and phase noise. A method of improving jitter performance by PLL band adjustment is a method of reducing noise by correction, whereas improving the jitter performance of the VCO corresponds to reduction of noise itself.

There are two kinds of VCO configurations capable of being integrated, that is, an LCVCO using a resonant circuit of an inductor and a capacitor, and a ring VCO. In general, the LCVCO excels the ring VCO in jitter performance. On the other hand, the ring VCO has advantages of having a wide frequency variable range, being able to output a plurality of output signals different from each other in phase, and not requiring an inductor, for example. Therefore the ring VCO is widely used in applications where a jitter performance requirement is not so stringent. Eliminating the need for an inductor, in particular, can not only greatly alleviate a disadvantage of generating an undesired electromagnetic field and thereby affecting other circuits, but also provide a great advantage in terms of cost because circuit area can be reduced greatly. For the above reasons, improvements of jitter and phase noise performance of the ring VCO are strongly desired.

FIG. 16 is a diagram showing an example of configuration of an ordinary ring VCO.

The ring VCO is generally formed by cascading a plurality of VCO cells equivalent to each other in the form of a ring.

The oscillation frequency fo of the ring VCO can be expressed by the following equation with the delay time Td of the VCO cells and the number N of stages of the VCO cells.

[Equation 1]

$$fo = 1/(2 \cdot N \cdot Td) \quad (1)$$

The output signals of adjacent VCO cells have a phase difference of $2\pi/N$ [rad].

The ring VCO is broadly divided into two types, that is, a differential type and a single-ended type.

FIG. 17 is a diagram showing an example of configuration of a cell in an ordinary single-ended VCO.

The VCO cell shown in FIG. 17 has a CMOS structure in which an n-type MOS transistor 501 and a p-type MOS transistor 502 are connected in series with each other, and has variable loads 503 and 504 provided on a ground side and a power supply side, respectively, of the CMOS structure. The CMOS structure shown in FIG. 17 may be replaced with a single-stage amplifier formed by one of the transistors. In addition, one of the two variable loads may be provided. When the number of cell stages in the single-ended VCO is an even number, the output signals of adjacent cells are stable in terms of direct current in a state of being alternately at a high level and a low level (latch). Therefore, to operate the single-ended VCO as an oscillating circuit, the number N of cell stages has to be an odd number.

FIG. 18 shows an example of configuration of an ordinary differential VCO cell.

The VCO cell shown in FIG. 18 has n-type MOS transistors 601 and 602 having sources connected to a common node, a current source circuit 605 for holding constant a current flowing from the common source to a ground GND, and loads 603 and 604 connected between a power supply voltage VDD and the drains of the MOS transistors 601 and 602. Differential signals are input to the gates of the MOS transistors 601 and 602, and differential signals inverted in phase are output from the drains of the MOS transistors 601 and 602.

Recent studies have shown that (under a condition of a same current consumption) the single-ended VCO generally excels the differential VCO in jitter and phase noise performance (see "Jitter and Phase Noise in Ring Oscillators", IEEE Journal of Solid-State Circuits, USA, June 1999, vol. 34, pp. 790 to 804 referred to as Non-Patent Document 1 hereinafter and "Oscillator Phase Noise: A Tutorial", IEEE Journal of Solid-State Circuits, USA, March 2000, vol. 35, pp. 326 to 336 referred to as Non-Patent Document 2 hereinafter). However, the single-ended VCO has a few disadvantages.

The first disadvantage is high sensitivity to power supply voltage. When the power supply voltage is varied or the power supply voltage includes noise, characteristics of the single-ended VCO vary greatly, and the jitter and phase noise performance of the single-ended VCO is degraded greatly.

The second disadvantage is the inability of the single-ended VCO to output orthogonal signals. As described above, the single-ended VCO is basically formed by an odd number of stages. Although there are a very large number of systems that may require orthogonal signals (signals having a phase difference of 90°) typified by IQ signals in radio communications, the single-ended type may not generate signals with a phase difference of 90° because of the odd number of stages thereof.

The third disadvantage is a single-ended signal, which tends to be affected by noise from other circuits on a same chip and, at the same time, tends to cause noise affecting these circuits.

The fourth disadvantage is a narrow frequency variable range in general, because the single-ended VCO controls resistance or capacitance, whereas the differential VCO controls total current.

On the other hand, the differential VCO does not have the four disadvantages described above, but is inferior in jitter and phase noise performance to the single-ended VCO. There are a plurality of reasons for this.

First, the differential VCO has small oscillation amplitude. This is because the lowest voltage of the amplitude is limited by the presence of the current source circuit.

Second, while the single-ended VCO can have a symmetric structure with respect to a power supply line and a ground line, this symmetry is generally lost in the differential VCO. This reduces the symmetry of a rising edge and a falling edge of an oscillation waveform, and degrades jitter and phase noise performance. It is known that the reduction in such symmetry has an adverse effect on flicker noise.

Third, in an ordinary differential-pair structure, the voltage of a tail node (N601 in FIG. 18) oscillates at a frequency twice the oscillation frequency. This oscillation distorts the oscillation waveform, and further impairs the symmetry and amplitude, thus constituting a factor in degrading the jitter and phase noise performance.

As described above, the single-ended ring VCO and the differential ring VCO have different advantages and different disadvantages. Various studies in the past have been conducted to realize a configuration that combines the above advantages (see "A Three-Stage Coupled Ring Oscillator with Quadrature Outputs" (IEEE ISCAS. 2001, USA, March 2001, vol. 1, pp. 6 to 9) referred to as Non-Patent Document 3 hereinafter, "A Coupled Two-Stage Ring Oscillator" (IEEE MWSCAS. 2001, USA, August 2001, vol. 2, pp. 878 to 881) referred to as Non-Patent Document 4 hereinafter, "A 900 MHz CMOS Low-Phase-Noise Voltage-Controlled Ring Oscillator With Wide Tuning Range" (IEEE Circuits and Systems II, USA, February 2001, vol. 48, pp. 216 to 221) referred to as Non-Patent Document 5 hereinafter, "A Novel Low Phase Noise 1.8V 900 MHz CMOS Voltage Controlled Ring Oscillator" (IEEE ISCAS. 2003, USA, May 2003, vol. 3, pp. 160 to 163) referred to as Non-Patent Document 6 hereinafter, "Comparison of Contemporary CMOS Ring Oscillators" (IEEE RFICS. 2004, USA, June 2004, pp. 281 to 284) referred to as Non-Patent Document 7 hereinafter, "A Low Phase Noise 2.0V 900 MHz CMOS Voltage Controlled Ring Oscillator" (IEEE ISCAS. 2004, USA, May 2004, vol. 4, pp. 533 to 536) referred to as Non-Patent Document 8 hereinafter, and "A Low Voltage 900 MHz Voltage Controlled Ring Oscillator With Wide Tuning Range" (IEEE APCCAS. 2004, USA, December 2004, vol. 1, pp. 301 to 304) referred to as Non-Patent Document 9 hereinafter).

SUMMARY OF THE INVENTION

In Non-Patent Documents 3 and 4, a ring VCO formed of two single-ended rings coupled with each other is proposed (FIG. 19). By providing the coupling between the two single-ended rings, a phase difference occurs between the rings, and the ring VCO as a whole generates orthogonal signals. FIG. 19 shows the configuration of a basic VCO cell.

This technique makes it possible to output orthogonal signals even with the single-ended type. However, the ring VCO still has high sensitivity to variations in power supply voltage because the ring VCO is a single-ended VCO. In addition, the ring VCO does not have structural symmetry with respect to a power supply line and a ground line, and does not have excellent jitter and phase noise characteristics.

Non-Patent Document 5 proposes a two-stage differential VCO including a VCO cell shown in FIG. 20B. The configuration of the differential VCO is simplified as compared with the VCO cells shown in FIG. 19, and the number of constituent elements is reduced. Therefore the differential VCO is improved in terms of device noise and current consumption, but essentially has the same problems as described above.

Non-Patent Documents 6 to 8 propose a VCO that makes a four-stage inverter ring oscillate by a devised biasing method, excels in jitter and phase noise performance, and can output orthogonal signals (FIG. 21).

This configuration is improved in structural symmetry with respect to a power supply line and a ground line as compared with the configurations of FIG. 19 and FIGS. 20A and 20B. However, the symmetry of connection of four oscillating nodes (N901 to N904) is reduced. The nodes N901 and N902 are connected to inverters, the gates of n-type MOS transistors, and the drains of p-type MOS transistors, whereas the nodes N903 and N904 are connected to inverters, the drains of the n-type MOS transistors, and the gates of the p-type MOS transistors. Due to this asymmetry, four orthogonal signals generated in this circuit may not retain precise orthogonality. In addition, the VCO of FIG. 21 has the four-stage inverter ring as a fundamental structure, and therefore has high sensitivity to variations in power supply voltage.

Non-Patent Document 9 proposes a two-stage differential VCO that controls delay time, that is, frequency by a CMOS switch type transmission line (CMOS Transmission Line) (FIGS. 22A, 22B, and 22C). FIG. 22A shows a general configuration of the VCO. FIG. 22B shows the CMOS transmission line. FIG. 22C shows a configuration of a differential VCO cell.

Unlike the configurations of FIGS. 19 to 21, this structure has both symmetry between nodes and symmetry with respect to a power supply line and a ground line. However, this VCO is apparently of a differential type, but is essentially of a single-ended type. Therefore the VCO has high sensitivity to variations in power supply voltage. In addition, an additional capacitive load is always imposed by the CMOS transmission line. Therefore current consumption is increased when a comparison is made at a same oscillation frequency.

"A Low-Phase-Noise CMOS Ring Oscillator With Differential Control And Quadrature Outputs" (IEEE ASIC/SOC Conf. 2001, USA, September 2001, pp. 134 to 138) (referred to as Non-Patent Document 10 hereinafter) proposes a differential VCO shown in FIG. 23A. As compared with the VCO shown in FIGS. 22A to 22C, two of four CMOS inverters forming a cell of the differential VCO are interposed between two variable current sources formed by a p-type MOS transistor and an n-type MOS transistor, respectively.

In Non-Patent Document 10, the CMOS inverters not interposed between these current sources are considered to be a latch structure for increasing operating speed of the differential cells interposed between the current sources, and this latch structure is not interposed between the current sources. The parts interposed between the two current sources are decreased in sensitivity to variations in power supply voltage. On the other hand, the other two CMOS inverters not interposed between the current sources are easily affected by variations in the power supply voltage. In addition, as described as the third disadvantage of the differential VCO, this structure causes voltage oscillation at a tail node, and thus degrades jitter and phase noise performance.

When control voltage (Vcontrol+ and Vcontrol−) is changed to vary oscillation frequency, the driving power of the differential cells interposed between the current sources is increased, while the driving power of the parts of the latch structure does not change very much. Therefore a ratio between the driving powers of the two types of inverters is changed. Thus, when the control voltage is changed to vary the frequency, various characteristics are changed, and stable oscillation may not be performed in some cases.

As described above, various studies have in the past been made of VCOs that combine the features of the differential type capable of generating orthogonal signals and the features of the single-ended type with low phase noise. When the existing VCOs are broadly classified, phase noise is reduced by devising the circuit configuration of cells in a differential VCO (FIGS. 20A and 20B, FIGS. 22A, 22B, and 22C, and FIGS. 23A and 23B), or the generation of orthogonal signals is made possible by providing an additional circuit to a single-ended VCO (FIG. 19 and FIG. 21). However, the former method reduces circuit symmetry with respect to a power supply line and a ground line as compared with the single-ended VCO in which cells are formed by inverters of a CMOS structure. The latter method reduces circuit symmetry with respect to each oscillating node by providing an additional circuit. There also remains a problem of high sensitivity to variations in power supply voltage.

Basically, when a single-ended VCO has even numbers of inverter stages, orthogonal signals may not be generated because each inverter is in a stable state in terms of direct current (latch state) and thus oscillation does not occur. However, to reduce phase noise may require use of an inverter of a circuit configuration that is symmetric with respect to a power supply line and a ground line (for example an inverter of a CMOS structure) if possible. For this, a configuration that can oscillate with even numbers of stages of inverters is desirable.

In addition, even with the configuration that can oscillate with even numbers of stages of inverters, oscillating signals having accurate phase differences may not be generated when circuit symmetry with respect to oscillating nodes is reduced as in the VCO shown in FIG. 21. Thus such a problem is desired to be remedied.

The present invention has been made in view of such situations, and it is desirable to provide an oscillating circuit capable of generating a plurality of oscillating signals having accurate phase differences using even numbers of inverters cascaded in the form of a ring.

According to a first embodiment of the present invention, there is provided an oscillating circuit including: N (N denotes even numbers of four or more) nodes outputting oscillating signals having respective different phases; a main loop circuit including N inverting circuits cascaded in a form of a ring via the N nodes; and a plurality of auxiliary loop circuits each including even numbers of inverting circuits cascaded in a form of a ring. Each inverting circuit in the auxiliary loop circuits is connected in parallel with even numbers of inverting circuits cascaded in the main loop circuit. Circuits configured to feed back signals from outputs to inputs of the respective inverters of the main loop circuit have circuit configurations equivalent to each other. Each inverting circuit in the main loop circuit and the auxiliary loop circuits drives an output line such that a phase of an output signal is inverted with respect to a phase of an input signal and has driving power that becomes lower when the phases of the output signal and the input signal are inverted with respect to each other than when the output signal and the input signal are in phase with each other.

According to a second embodiment of the present invention, there is provided an oscillating circuit including: N (N denotes even numbers of four or more) nodes outputting oscillating signals having respective different phases; a main loop circuit including N inverting circuits cascaded in a form of a ring via the N nodes; and (N/2) auxiliary loop circuits each including two inverting circuits cascaded in a form of a ring via two nodes of the N nodes. Each inverting circuit in the auxiliary loop circuits is connected in parallel with (N/2) inverting circuits cascaded in the main loop circuit. The (N/2) auxiliary loop circuits are connected to respective different nodes of the N nodes. Each inverting circuit in the main loop circuit and the auxiliary loop circuits drives an output line such that a phase of an output signal is inverted with respect to a phase of an input signal and has driving power that becomes lower when the phases of the output signal and the input signal are inverted with respect to each other than when the output signal and the input signal are in phase with each other.

Preferably, the oscillating circuits according to the first embodiment and the second embodiment include: a common node to which power supply input terminals of the respective inverting circuits of the main loop circuit and the auxiliary loop circuits are commonly connected; and a current source circuit configured to hold constant a sum total of power supply currents supplied to the respective inverting circuits via the common node.

In addition, the current source circuit may change the sum total of the power supply currents according to an input control signal.

Each inverting circuit in the main loop circuit and the auxiliary loop circuits may have a first transistor of a first conduction type and a second transistor of a second conduction type connected in series with each other. In this case, one terminal of a series circuit of the first transistor and the second transistor is connected to the common node.

According to the present invention, it is possible to generate a plurality of oscillating signals having accurate phase differences using even numbers of inverters cascaded in the form of a ring.

BRIEF DESCRIPTION OF THE DRAWINGS

FIGS. 22A, 22B, and 22C are fourth diagrams showing an example of configuration of a VCO in the past.

DETAILED DESCRIPTION OF THE PREFERRED EMBODIMENTS

<First Embodiment>

Constituent elements of an oscillating circuit according to an embodiment of the present invention will first be described with reference to FIGS. 1 to 4B.

Figure 1:
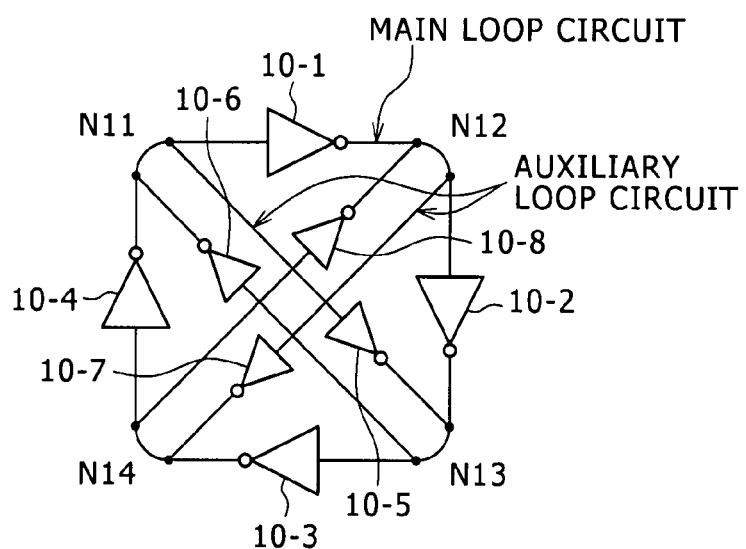
FIG. 1 is a diagram showing an example of configuration of an oscillating circuit according to an embodiment of the present invention.

FIG. 1 is a diagram showing an example of configuration of an oscillating circuit according to an embodiment of the present invention.

Figures 2A, 2B, 2C:
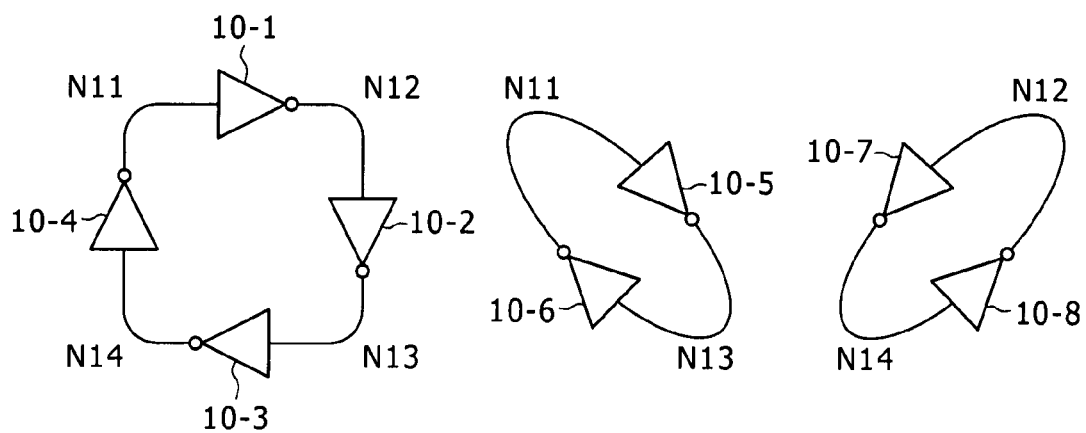
FIGS. 2A, 2B, and 2C are diagrams showing three loop circuits included in the oscillating circuit shown in FIG. 1.

FIGS. 2A, 2B, and 2C are diagrams showing three loop circuits included in the oscillating circuit.

Figure 3:
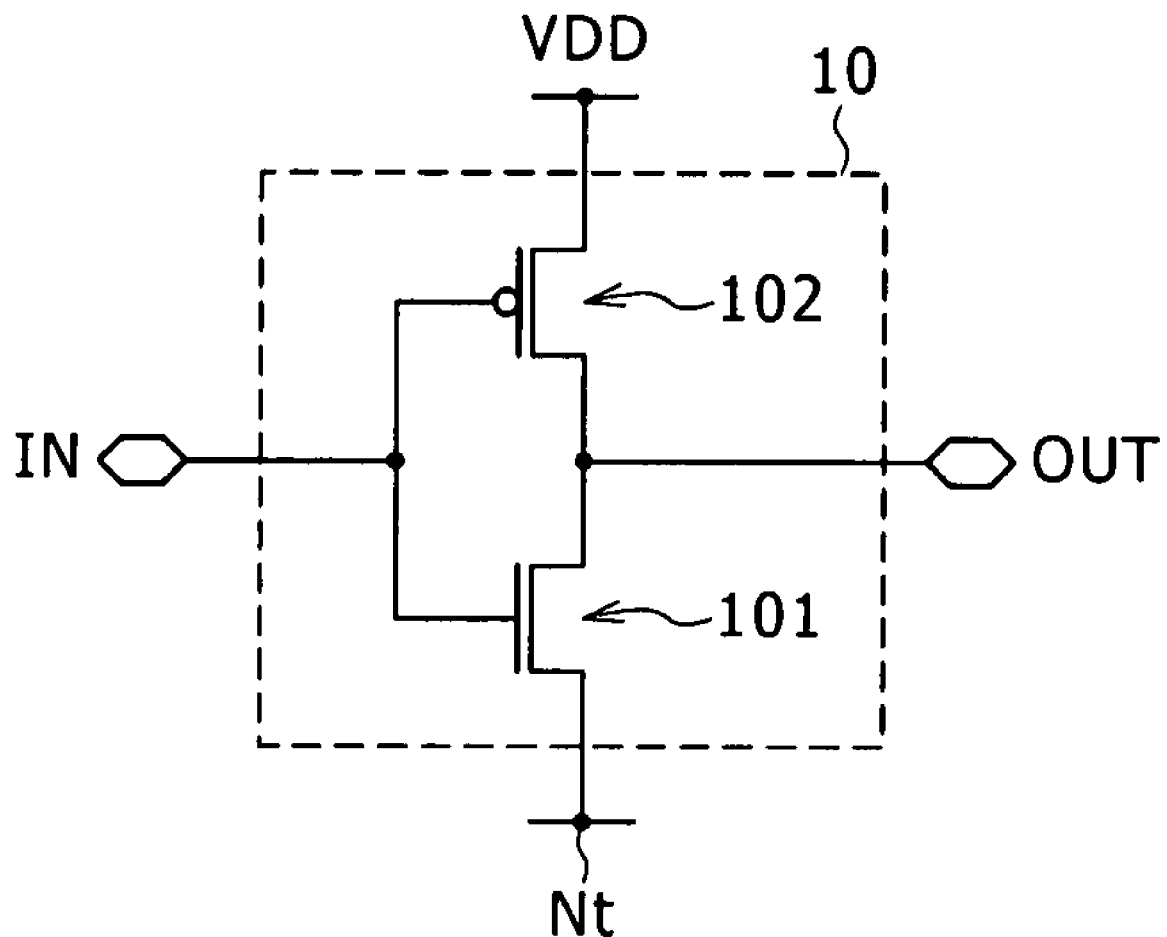
FIG. 3 is a diagram showing an example of configuration of an inverter (inverting circuit) forming the oscillating circuit shown in FIG. 1.

FIG. 3 is a diagram showing an example of an inverter (inverting circuit) forming the oscillating circuit.

Figure 4A:
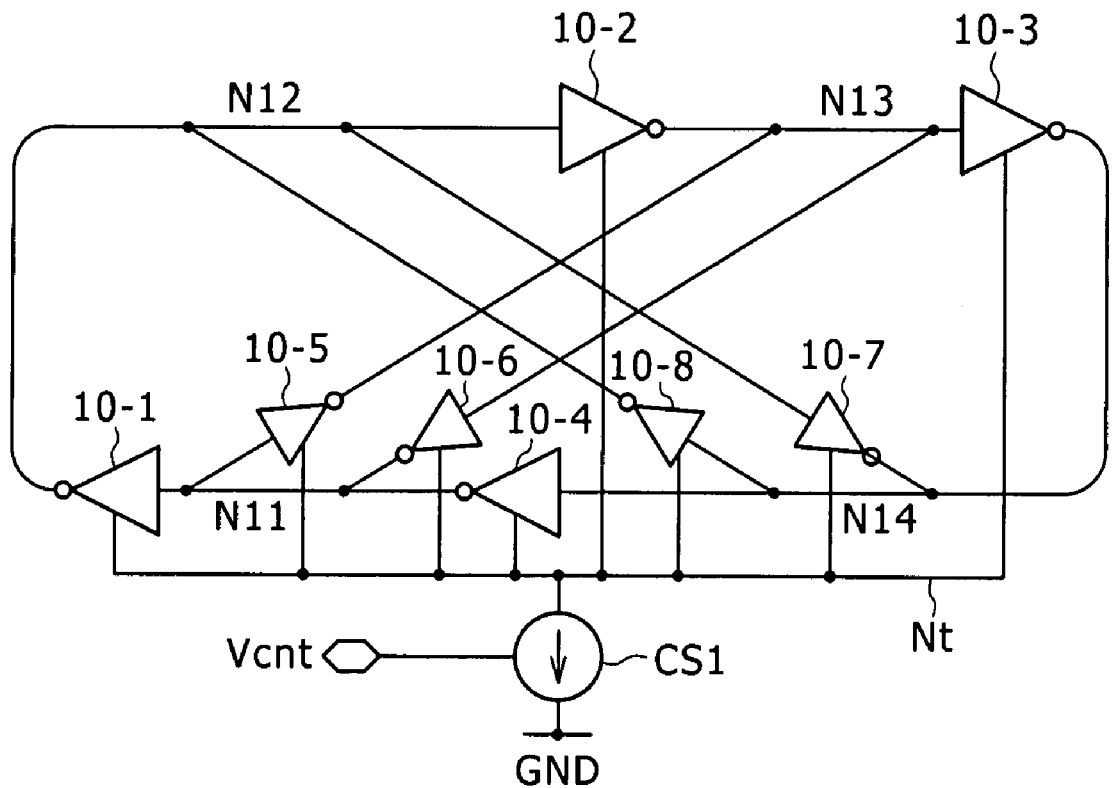
FIGS. 4A and 4B are diagrams showing an example of a current source circuit for controlling the power supply current of each inverter.
Figure 4B:
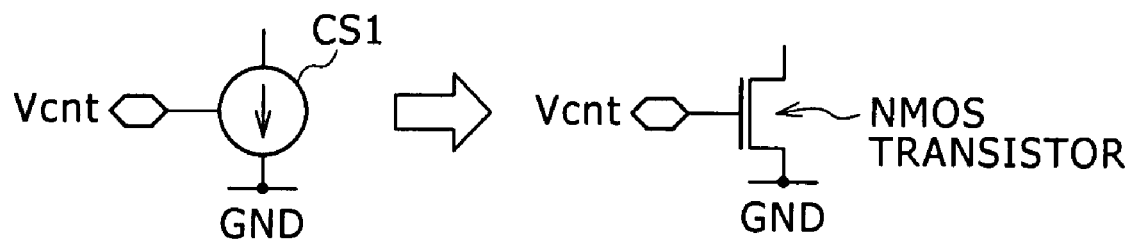

FIGS. 4A and 4B are diagrams showing an example of a current source circuit for controlling the power supply current of each inverter.

The oscillating circuit shown in FIG. 1 has eight inverters (10-1 to 10-8). These inverters form three loop circuits as shown in FIGS. 2A to 2C. Specifically, the inverters 10-1 to 10-4 form a main loop circuit (FIG. 2A), the inverters 10-5 and 10-6 form an auxiliary loop circuit (FIG. 2B), and the inverters 10-7 and 10-8 form an auxiliary loop circuit (FIG. 2C).

In the main loop circuit shown in FIG. 2A, the four inverters (10-1 to 10-4) are cascaded in the form of a ring via four nodes (N11 to N14). The input and output of the inverter 10-1 are connected to a node N11 and a node N12, respectively. The input and output of the inverter 10-2 are connected to the node N12 and a node N13, respectively. The input and output of the inverter 10-3 are connected to the node N13 and a node N14, respectively. The input and output of the inverter 10-4 are connected to the node N14 and the node N11, respectively.

In the auxiliary loop circuit shown in FIG. 2B, the two inverters (10-5 and 10-6) are cascaded in the form of a ring via the nodes N11 and N13. The input and output of the inverter 10-5 are connected to the node N11 and the node N13, respectively. The input and output of the inverter 10-6 are connected to the node N13 and the node N11, respectively.

In the auxiliary loop circuit shown in FIG. 2C, the two inverters (10-7 and 10-8) are cascaded in the form of a ring via the nodes N12 and N14. The input and output of the inverter 10-7 are connected to the node N12 and the node N14, respectively. The input and output of the inverter 10-8 are connected to the node N14 and the node N12, respectively.

Each of the inverters (10-1 to 10-8) forming the oscillating circuit has an n-type MOS transistor 101 and a p-type MOS transistor 102 connected in series with each other as shown in FIG. 3, for example.

The MOS transistor 101 has a source connected to a node Nt, a drain connected to an output terminal OUT, and a gate connected to an input terminal IN. The MOS transistor 102 has a source connected to a power supply voltage VDD, a drain connected to the output terminal OUT, and a gate connected to the input terminal.

When the voltage of the input terminal IN is at a high level, the MOS transistor 101 is turned on, and the MOS transistor 102 is turned off, so that the output terminal OUT is at a low level. Conversely, when the voltage of the input terminal IN is at a low level, the MOS transistor 101 is turned off, and the MOS transistor 102 is turned on, so that the output terminal OUT is at a high level.

The source (that is, a negative-side power supply input terminal) of the MOS transistor 101 of each of the inverters (10-1 to 10-8) is connected to the common node Nt. The oscillating circuit according to the present embodiment has a current source circuit CS1 connected between the node Nt and a ground GND.

The current source circuit CS1 holds constant a sum total of power supply currents supplied to the respective inverters (10-1 to 10-8) via the node Nt as shown in FIG. 4A. In addition, the current source circuit CS1 can change the sum total of the power supply currents according to a control signal Vcnt input to the current source circuit CS1.

The current source circuit CS1 is formed by an n-type MOS transistor connected between the node Nt and a reference potential VSS, as shown in FIG. 4B, for example. This MOS transistor changes a current flowing from the node Nt to the reference potential VSS according to the control signal Vcnt input to the gate of the MOS transistor.

In the oscillating circuit according to the present embodiment, the frequency of the oscillating circuit is controlled by changing the current of the current source circuit CS1 according to the control signal Vcnt.

The oscillation mechanism of the oscillating circuit according to the present embodiment having the above-described configuration will next be described.

Description will first be made of the fact that the oscillating circuit does not oscillate merely on the linear operation of the inverters.

The loop circuits shown in FIGS. 2A to 2C each have even numbers of inverters cascaded in the form of a ring, and each form a latch system. That is, when the potentials of nodes adjacent to each other alternately become a high level or a low level, the loop circuit is in a stable state in terms of direct current (latch state), and therefore does not oscillate.

Combining the three loop circuits shown in FIGS. 2A to 2C as shown in FIG. 1 does not essentially eliminate this latch state.

Figure 5:
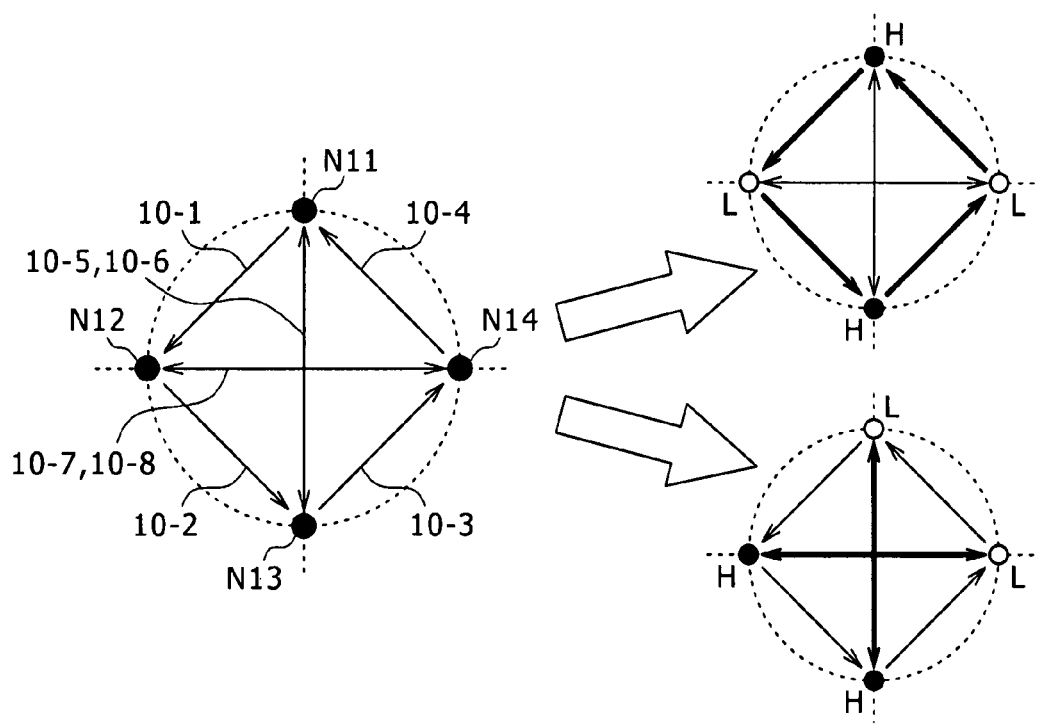
FIG. 5 is a diagram of assistance in explaining different latch states of the oscillating circuit shown in FIG. 1.

FIG. 5 is a diagram of assistance in explaining different latch states of the oscillating circuit shown in FIG. 1.

In FIG. 5, circles represent a node (N11 to N14), and arrows represent an inverter. Outline circles indicate a low level, and black solid circles indicate a high level.

As shown in FIG. 5, the latch state of the main loop circuit (10-1 to 10-4) and the latch states of the auxiliary loop circuits (10-5 and 10-6 and 10-7 and 10-8) are different from each other, and are not compatible with each other. Assuming that each inverter has an ideally constant gain, when there are different latch states as shown in FIG. 5, the latch state of a loop circuit having inverters with a high gain takes precedence.

Thus, the oscillating circuit according to the present embodiment does not oscillate when the linear operation of the inverters is supposed. That is, the oscillation mechanism of the present oscillating circuit is essentially different from that of an existing oscillating circuit such as linear feedback or linear feedforward.

The oscillation mechanism of the oscillating circuit according to the present embodiment originates from nonlinearity of the inverters.

An inverter of a CMOS structure has a characteristic of varying in gain (driving power) according to the level of an output signal. When the inverter is in an inverting state (a state in which an input voltage and an output voltage are logically inverted with respect to each other), a MOS transistor in an on state operates in a triode region, so that the driving power of the MOS transistor is decreased. On the other hand, when the inverter is in a non-inverting state (a state in which the input potential and the output potential logically coincide with each other), the MOS transistor in the on state operates in a saturation region, so that the driving power of the MOS transistor is increased.

FIG. 6 is a diagram of assistance in explaining the nonlinearity of the inverters, showing an example in which the input voltage is at a high level.

When the input voltage is at a high level, the n-type MOS transistor 101 is turned on. When the output voltage becomes a low level in this state, the MOS transistor 101 operates in the triode region, and therefore the gain gm of the MOS transistor 101 is decreased. On the other hand, when the output voltage becomes a high level, the MOS transistor 101 operates in the saturation region, and therefore the gain gm of the MOS transistor 101 is increased. Also in the case where the input voltage is at a low level, the above argument holds in exactly the same manner with the transistor in the on state changed to the p-type MOS transistor 102.

Such nonlinearity of the inverters allows the oscillating circuit according to the present embodiment to oscillate.

As described above, when inverters operate in a linear region, the oscillating circuit falls into a latch state determined by the loop circuit with a high driving power. However, since the inverters forming the loop circuit have the above-described nonlinearity, once the oscillating circuit falls into the latch state, the driving power of the loop circuit determining the latch state is decreased. On the other hand, this latch state is a (partial) non-inverting state for another loop circuit, and thus the driving power of the other loop circuit is conversely increased. Hence, when the relation in magnitude between the driving powers of the two loop circuits is inverted in this latch state, the oscillating circuit makes a transition from the present latch state to another latch state. Then, the driving power inversion is caused again by making the transition to the new latch state. Oscillation is brought about by repeating the above process. Such driving power inversion can be surely effected by properly selecting characteristics (size of the transistors of the inverters or the like) of the main loop circuit and the auxiliary loop circuits.

The nonlinear oscillation mechanism having the above-described characteristics will be referred to as an SL (switching latch) mechanism in the present specification. In addition, an oscillating circuit oscillating on the basis of the SL mechanism will be referred to as an SLVCO (switching latch voltage controlled oscillator). The SL mechanism has not heretofore been recognized because of the rare property of the nonlinear characteristic. The oscillating circuit according to the present invention is essentially different from the existing technology in that the oscillating circuit oscillates on the basis of the SL mechanism.

Figure 7:
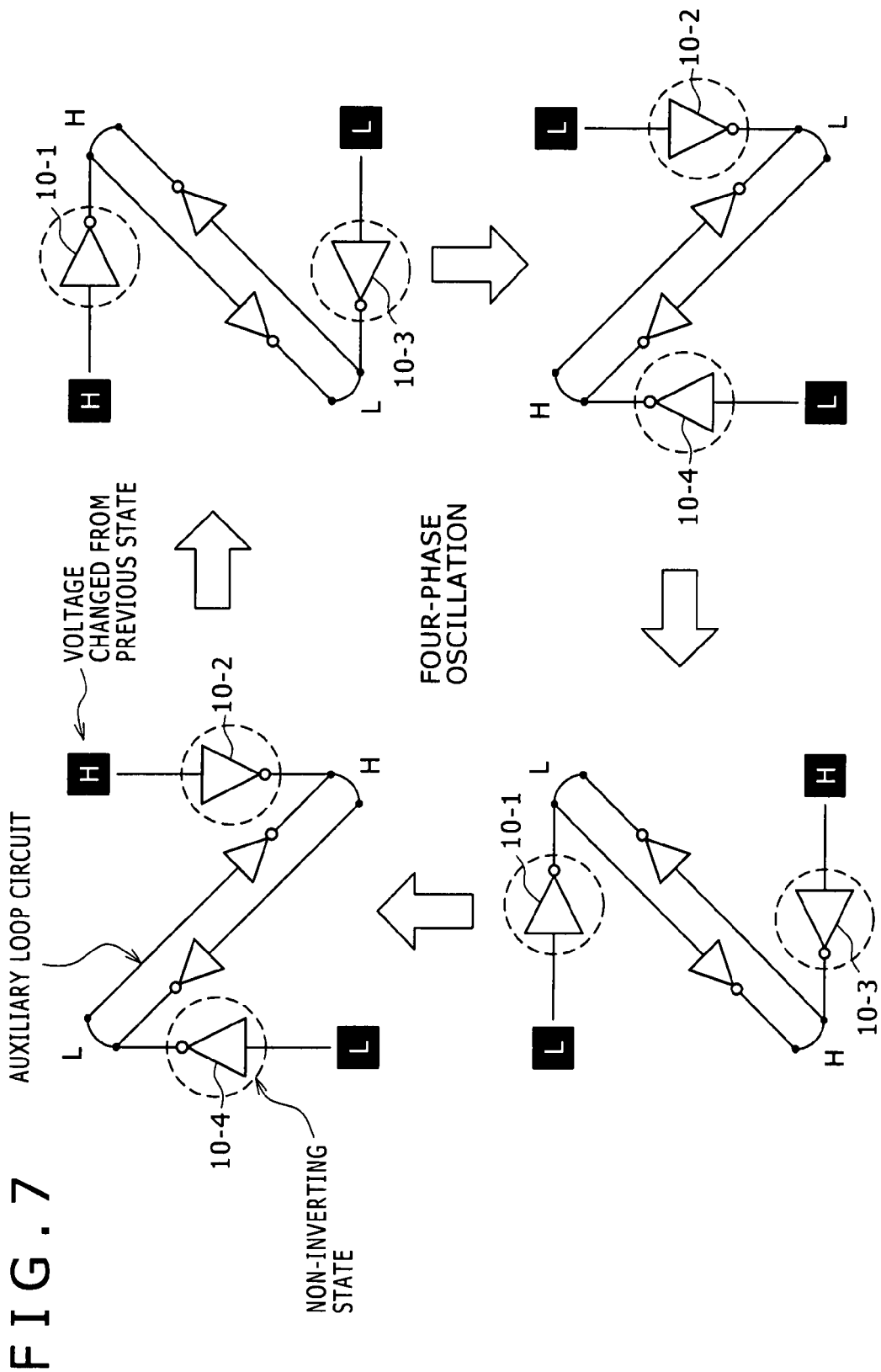
FIG. 7 is a diagram schematically representing the oscillation mechanism of the oscillating circuit shown in FIG. 1.

FIG. 7 is a diagram schematically representing the SL mechanism of the oscillating circuit shown in FIG. 1. A dotted-line circle enclosing an inverter in FIG. 7 indicates that the inverter is in a non-inverting state (a state in which an input and an output are at a same logical level). FIG. 7 shows inverters involved in state transitions of the SL mechanism for simplicity of the figure.

In the example of FIG. 7, when the inverters 10-4 and 10-2 of the main loop circuit are brought into a non-inverting state, the increased driving power of the inverters 10-4 and 10-2 becomes higher than the driving power of the auxiliary loop circuit (10-5 and 10-6), and inverts the logical level of the auxiliary loop circuit (10-5 and 10-6). Then, the inverters 10-1 and 10-3 in a subsequent stage are brought into a non-inverting state, and the increased driving power of the inverters 10-1 and 10-3 inverts the logical level of the auxiliary loop circuit (10-7 and 10-8). Thus, the four inverters 10-1 to 10-4 of the main loop circuit sequentially make a transition to the non-inverting state, whereby four-phase oscillation occurs.

Incidentally, while voltage is represented by logical levels (a high level "H" and a low level "L") for simplicity of description in the example of FIG. 7, the voltage is analog voltage in an actual oscillating circuit. In addition, digitally switching between the four states as shown in FIG. 7 is not performed, and a transition to each state has a temporal overlap.

Figure 6A:
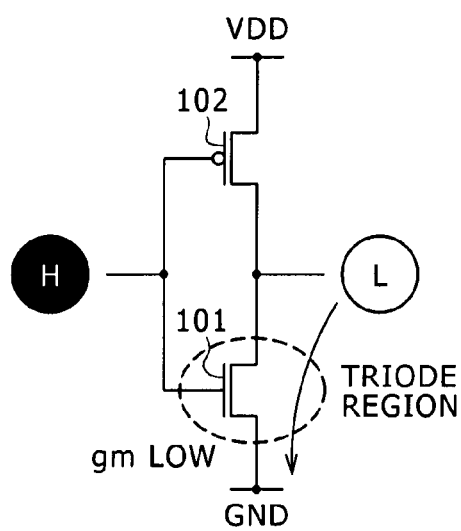
FIGS. 6A and 6B are diagrams of assistance in explaining the nonlinearity of an inverter.
Figure 6B:
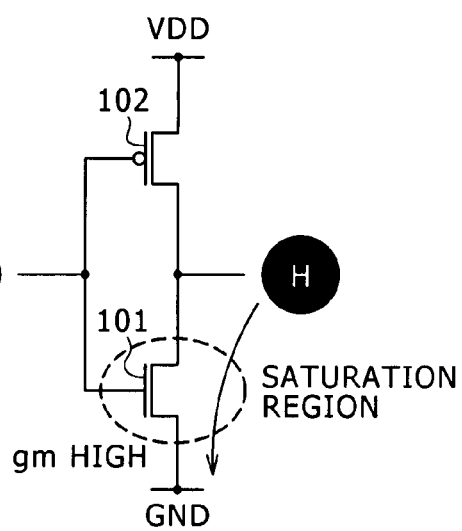

As shown in FIGS. 6A and 6B, the driving power of an inverter, more specifically the transconductance Gm of the inverter can be expressed by a function Gm (Vin, Vout) dependent on an input voltage Vin and an output voltage Vout. Oscillation based on the SL mechanism is realized by the nonlinearity of the inverter, specifically the dependence of the transconductance on the output voltage.

Figure 8A:
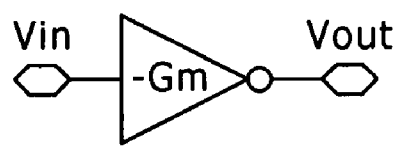
FIGS. 8A and 8B are diagrams of assistance in explaining the transconductance of an inverter.
Figure 8B:
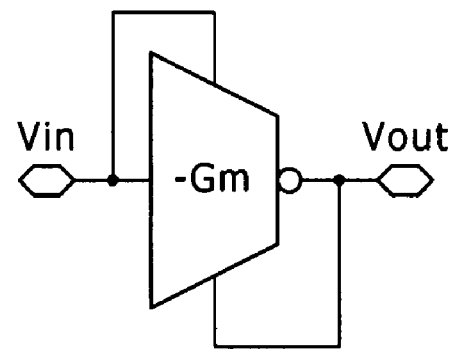

FIGS. 8A and 8B are diagrams of assistance in explaining the transconductance Gm of an inverter. Considering the nonlinearity of the inverter, the inverter having a transconductance "−Gm" as shown in FIG. 8A is treated as a circuit that changes the transconductance "−Gm" according to an input voltage and an output voltage as shown in FIG. 8B.

Hence, an inverter (inverting circuit) in an SLVCO is not necessarily limited to a CMOS structure, and an SLVCO can be realized with a circuit of another configuration having a similar nonlinear characteristic. That is, the circuit configuration of the inverting circuit is arbitrary as long as the inverting circuit drives an output line such that the phase of an output signal is inverted with respect to the phase of an input signal and has nonlinearity such that the driving power of the inverting circuit is lower when the phases of the output signal and the input signal are inverted with respect to each other than when the output signal and the input signal are in phase with each other.

In order to realize oscillation based on the SL mechanism, it is necessary to combine a plurality of loop circuits having different latch states, in addition to using inverters (inverting circuits) having nonlinearity.

In the oscillating circuit shown in FIG. 1, to satisfy the latter condition, each of the inverters forming the auxiliary loop circuits (FIGS. 2B and 2C) is connected in parallel with even numbers of inverters cascaded in the main loop circuit (FIG. 2A). For example, the inverter 10-5 of the auxiliary loop circuit (FIG. 2B) is connected in parallel with the inverters 10-1 and 10-2 (inverters 10-3 and 10-4) cascaded in the main loop circuit.

The input and output of even numbers of cascaded inverters have the same voltage in terms of direct current. When the even number of cascaded inverters are connected in parallel with one inverter, the direct-current state of the even number of cascaded inverters is always opposite to the direct-current state of the one inverter. Therefore, each of the inverters forming the auxiliary loop circuits (FIGS. 2B and 2C) is connected to the main loop circuit (FIG. 2A) such that the direct-current state of the inverter is opposite to the direct-current state of the main loop circuit. As a result, the main loop circuit (FIG. 2A) and the auxiliary loop circuits (FIGS. 2B and 2C) have latch states different from each other.

Description will next be made of a relation between phase differences of oscillating signals generated at the nodes N11 to N14 and the topology of the oscillating circuit.

In the oscillating circuit shown in FIG. 1, the inverters (10-1 to 10-8) are coupled with each other such that circuit coupling relation (topology) to the nodes N11 to N14 is symmetric. That is, the circuit topology of the oscillating circuit shown in FIG. 1 has four-fold rotational symmetry with respect to the four nodes N11 to N14.

In other words, in the oscillating circuit shown in FIG. 1, circuits for feeding back signals from the outputs to the inputs of the respective inverters (10-1 to 10-4) of the main loop circuit (FIG. 2A) have circuit configurations equivalent to each other.

Because of the symmetry of such a circuit topology, the inverters (10-1 to 10-4) of the main loop circuit operate symmetrically. As a result, the signal delays of the inverters (10-1 to 10-8) become equal to each other, and oscillating signals generated at adjacent nodes of the nodes N11 to N14 have precisely a phase difference of 90° (360°÷4).

Description will next be made of voltage oscillation at the node Nt.

Currents flowing from the inverters (10-1 to 10-8) to the node Nt are determined by potential differences (gate-to-source voltage Vgs of the MOS transistor 101) between the input voltages (voltages of the nodes N11 to N14) of the inverters and the voltage of the node Nt. When the voltage of the node Nt becomes low with respect to the input voltage of an inverter, the impedance of the MOS transistor 101 is decreased, and a current flowing through the node Nt is increased. Conversely, when the voltage of the node Nt approaches the input voltage of the inverter, the current flowing through the node Nt is decreased.

Supposing that the node Nt is connected to one inverter, the voltage of the node Nt is controlled by the constant-current operation of the current source circuit CS1 so as to hold constant the current of the MOS transistor 101. Therefore the voltage of the node Nt varies greatly according to the input voltage of the inverter. For example, when the input voltage of the inverter is increased, the current source circuit CS1 greatly lowers the voltage of the node Nt so as to maintain the constant current.

However, the oscillating circuit according to the present embodiment has the eight inverters 10-1 to 10-8 connected to the node Nt, and the inverters operate periodically and uniformly because of the symmetry of the above-described circuit topology. Specifically, because the voltages of the nodes N11 to N14 sequentially reach a maximum in every ¼ of a cycle, the input voltage of two inverters (one in a main loop and one in an auxiliary loop) reaches a maximum in every ¼ of a cycle.

Hence, even when the input voltage of a certain inverter is changed from a high level to a low level, the input voltage of another inverter is changed from the low level to the high level so as to replace the input voltage of the certain inverter. As a result, even when a current flowing from a certain inverter to the node Nt is decreased, a current flowing from another inverter to the node Nt is increased. The current source circuit CS1 can therefore maintain constant current without greatly varying the voltage of the node Nt.

In addition, periods for which the inverters supply current to the node Nt during one cycle of oscillation and the magnitudes of peaks of the currents are substantially uniform, and a flow of a considerably unbalanced current to a particular inverter does not occur. This also suppresses changes in the voltage of the constant-current node Nt.

Thus, the oscillating circuit according to the present embodiment causes very little voltage oscillation at the node Nt.

When very little voltage oscillation occurs at the node Nt, and the potential of the node Nt can be considered to be substantially constant, the inverters 10-1 to 10-8 having the circuit configuration shown in FIG. 3 have a very high symmetry with respect to a power supply line and a ground line. Hence, jitter and phase noise in the oscillating circuit according to the present embodiment are greatly reduced as compared with an ordinary differential VCO. In addition, because of very little voltage oscillation at the node Nt, the constant-current operation of the current source circuit CS1 is more stabilized. Thus, constant current flows even when the power supply voltage is varied, and therefore the oscillating circuit according to the present embodiment has low sensitivity to variations in the power supply voltage.

As described above, the oscillating circuit according to the present embodiment includes the main loop circuit (10-1 to 10-4) having four inverters connected in the form of a ring via the four nodes N11 to N14 and the two auxiliary loop circuits (10-5 and 10-6 and 10-7 and 10-8) each having two inverters connected in the form of a ring. In addition, each inverter in the auxiliary loop circuits is connected in parallel with inverter circuits in two stages connected in series with each other in the main loop circuit. Further, each of the inverters (10-1 to 10-8) in the main loop circuit and the auxiliary loop circuits has characteristics of driving an output line such that the phase of an output signal is inverted with respect to the phase of an input signal and making the driving power of the inverter lower when the phases of the output signal and the input signal are inverted with respect to each other than when the output signal and the input signal are in phase with each other.

Hence, the main loop circuit and the auxiliary loop circuits have latch states different from each other. In addition, when a transition is made to a latch state determined by one loop circuit, the driving power of the loop circuit is surpassed by the driving power of another loop circuit, so that a transition is made to a latch state determined by the other loop circuit. By repeating such a latch state transition, even the configuration having even numbers of inverters connected in the form of a ring can be made to oscillate.

In addition, in the oscillating circuit according to the present embodiment, circuits for feeding back signals from the outputs to the inputs of the respective inverters (10-1 to 10-4) of the main loop circuit have circuit configurations equivalent to each other. Thus, the signal delays of these inverters become substantially equal to each other, and oscillating signals generated at adjacent nodes of the nodes N11 to N14 have precisely a phase difference of 90°.

Hence, even with the configuration having even numbers of (four) stages of inverter circuits cascaded in the form of a ring, the oscillating circuit according to the present embodiment can generate a plurality of (four) oscillating signals having precise phase differences.

Further, in the oscillating circuit according to the present embodiment, the power supply input terminals of the respective inverters (10-1 to 10-8) of the main loop circuit and the auxiliary loop circuits are connected to the common node Nt, and a sum total of power supply currents supplied to the respective inverters via the node Nt is maintained at a certain value by the current source circuit CS1.

Thereby the voltage oscillation of the node Nt can be reduced to be very little oscillation. Thus, by applying a circuit of a structure symmetric with respect to a power supply side and a ground side, such for example as a CMOS structure, to each inverter (10-1 to 10-8), it is possible to greatly reduce jitter and phase noise.

Further, since the current source circuit CS1 controls the current flowing through each inverter (10-1 to 10-8) to a constant value according to the control signal Vcnt, the sensitivity of the oscillating circuit according to the present embodiment to the power supply voltage VDD can be lowered as compared with an ordinary single-ended VCO. That is, it is possible to suppress changes in oscillation characteristics due to variations in the power supply voltage VDD.

In addition, the oscillating circuit according to the present embodiment controls oscillation frequency by controlling the current value of the current source circuit CS1, so that a frequency adjusting range can be widened as compared with an ordinary single-ended VCO that controls oscillation frequency by adjusting a resistance value or a capacitance value.

Thus, according to the present embodiment, by using an oscillation phenomenon based on the nonlinearity of the inverters, it is possible to realize an oscillating circuit that combines the advantages of a differential VCO that generates orthogonal signals, has low sensitivity to variations in power supply voltage, and has a wide frequency variable range with the advantages of a single-ended VCO that is excellent in jitter performance and phase noise performance.

An example of modification of the oscillating circuit according to the present embodiment will next be described.

While the oscillating circuit shown in FIG. 1 is an example in which the number of stages of inverters in the main loop circuit is four, the number of stages is arbitrary as long as the numbers of stages is even numbers of four or more.

Description will be made below of an oscillating circuit as an example in which the number of stages of inverters in a main loop circuit is eight.

Figure 9:
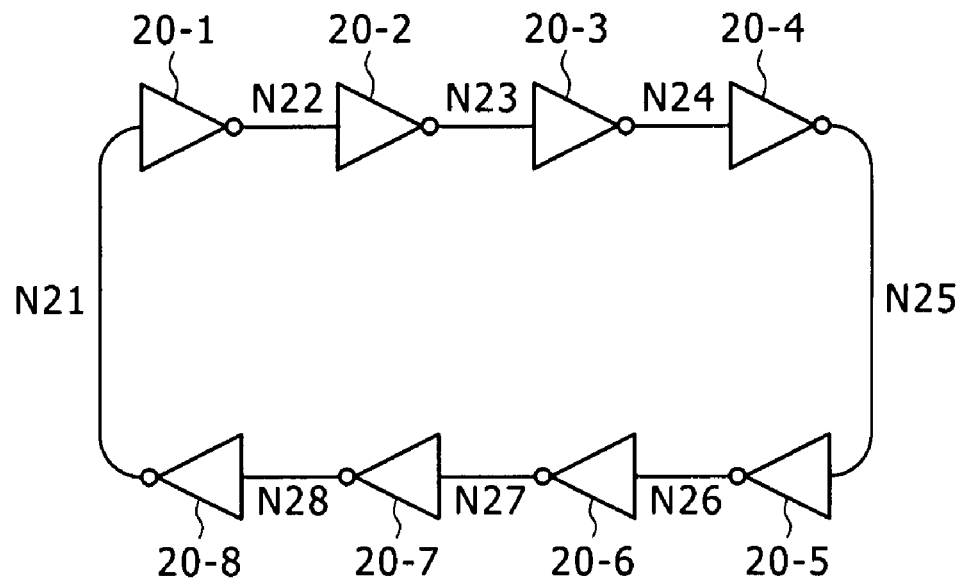
FIG. 9 is a diagram showing an example of an eight-stage loop circuit.

The main loop circuit shown in FIG. 9 has eight inverters (20-1 to 20-8) cascaded in the form of a ring via eight nodes (N21 to N28).

The input and output of the inverter 20-1 are connected to the node N21 and the node N22, respectively. The input and output of the inverter 20-2 are connected to the node N22 and the node N23, respectively. The input and output of the inverter 20-3 are connected to the node N23 and the node N24, respectively. The input and output of the inverter 20-4 are connected to the node N24 and the node N25, respectively. The input and output of the inverter 20-5 are connected to the node N25 and the node N26, respectively. The input and output of the inverter 20-6 are connected to the node N26 and the node N27, respectively. The input and output of the inverter 20-7 are connected to the node N27 and the node N28, respectively. The input and output of the inverter 20-8 are connected to the node N28 and the node N21, respectively.

In order to produce the oscillation of the above-described SL mechanism using the eight-stage main loop circuit shown in FIG. 9, auxiliary loop circuits need to be provided in such a manner as to satisfy the following conditions.

(1) There are even numbers of stages of inverters cascaded in the form of a ring in the auxiliary loop circuits.

(2) Each inverter in the auxiliary loop circuits is connected in parallel with even numbers of inverters cascaded in the main loop circuit.

From the condition of (1), the auxiliary loop circuits form a latch system. From the condition of (2), the main loop circuit and the auxiliary loop circuits have latch states different from each other.

The oscillation based on the SL mechanism is produced on the two conditions as well as the condition of nonlinear operation of the inverters as described above.

Further, in addition to the above conditions, the following condition is necessary so that oscillating signals at any adjacent nodes of the nodes N21 to N28 have the same phase difference (that is, 45°).

(3) Circuits for feeding back signals from the outputs to the inputs of the respective inverters of the main loop circuit have circuit configurations equivalent to each other. In other words, circuit topology with respect to the eight nodes (N21 to N28) is symmetric.

When the number of stages of the main loop circuit is eight, there are two numbers, two and four, as the number of stages of the auxiliary loop circuits satisfying the above-described conditions of (1) to (3).

Figure 10A:
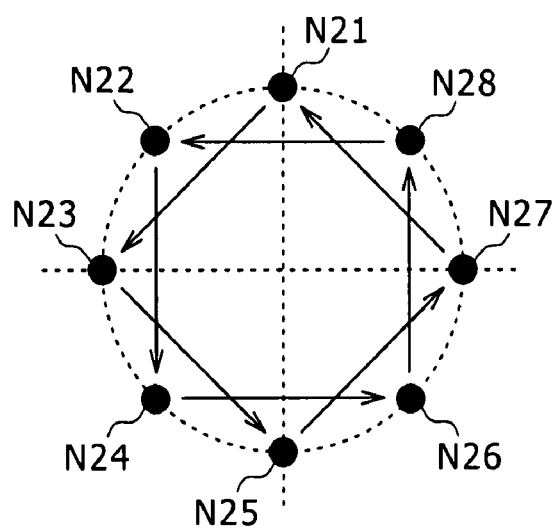
FIGS. 10A, 10B, and 10C are first diagrams showing an example of modification of the oscillating circuit according to the present embodiment.
Figure 10B:
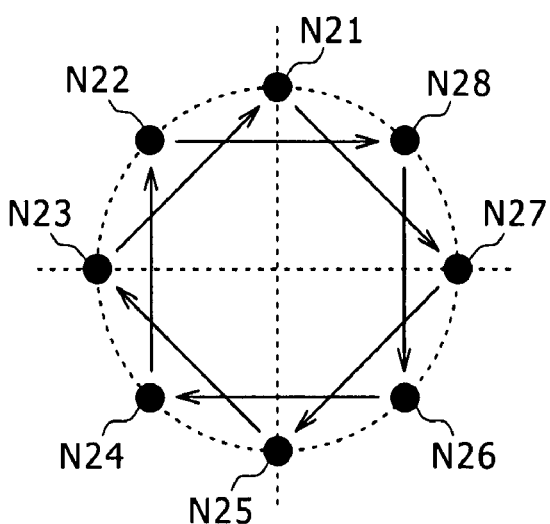
Figure 10C:
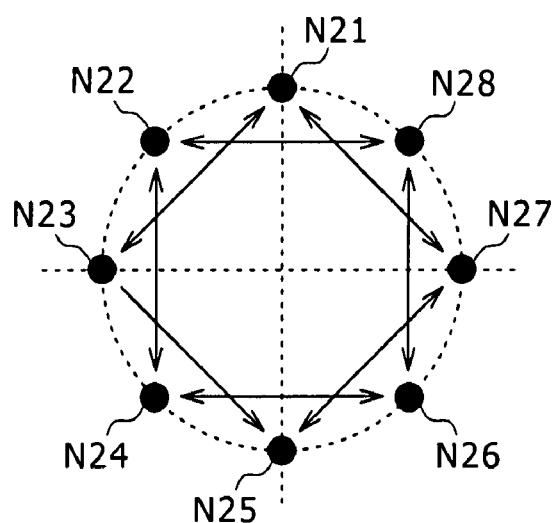
Figure 11:
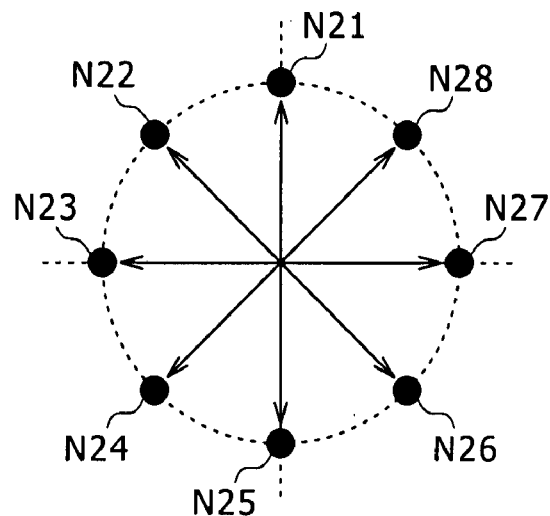
FIG. 11 is a second diagram showing an example of modification of the oscillating circuit according to the present embodiment.

FIGS. 10A, 10B, and 10C show an example of configuration of an oscillating circuit in which the number of stages of an auxiliary loop circuit is four. FIG. 11 shows an example of configuration of an oscillating circuit in which the number of stages of an auxiliary loop circuit is two. Incidentally, the meanings of symbols (circles and arrows) in FIGS. 10A, 10B, and 10C and FIG. 11 are the same as in FIG. 5.

When the number of stages of an auxiliary loop circuit is four, there are three configurations as shown in FIGS. 10A, 10B, and 10C.

In addition to the eight-stage main loop circuit shown in FIG. 9, an oscillating circuit shown in FIG. 10A has a four-stage auxiliary loop circuit transmitting a signal from the node N21 to the nodes N23, N25, N27, and N21 in this order and a four-stage auxiliary loop circuit transmitting a signal from the node N22 to the nodes N24, N26, N28, and N22 in this order.

In addition to the eight-stage main loop circuit shown in FIG. 9, an oscillating circuit shown in FIG. 10B has a four-stage auxiliary loop circuit transmitting a signal from the node N21 to the nodes N27, N25, N23, and N21 in this order and a four-stage auxiliary loop circuit transmitting a signal from the node N22 to the nodes N28, N26, N24, and N22 in this order.

The oscillating circuits shown in FIGS. 10A and 10B each have two four-stage auxiliary loop circuits, but have opposite directions of signal transmission.

On the other hand, an oscillating circuit shown in FIG. 10C has four auxiliary loop circuits obtained by combining the two auxiliary loop circuits in the oscillating circuit shown in FIG. 10A with the two auxiliary loop circuits in the oscillating circuit shown in FIG. 10B, in addition to the eight-stage main loop circuit shown in FIG. 9.

When the number of stages of an auxiliary loop circuit is two, there is one configuration as shown in FIG. 11.

In addition to the eight-stage main loop circuit shown in FIG. 9, an oscillating circuit shown in FIG. 11 has a two-stage auxiliary loop circuit connected to the nodes N21 and N25, a two-stage auxiliary loop circuit connected to the nodes N22 and N26, a two-stage auxiliary loop circuit connected to the nodes N23 and N27, and a two-stage auxiliary loop circuit connected to the nodes N24 and N28. The four auxiliary loop circuits are each connected to respective different nodes of the eight nodes N21 to N28.

Figure 12:
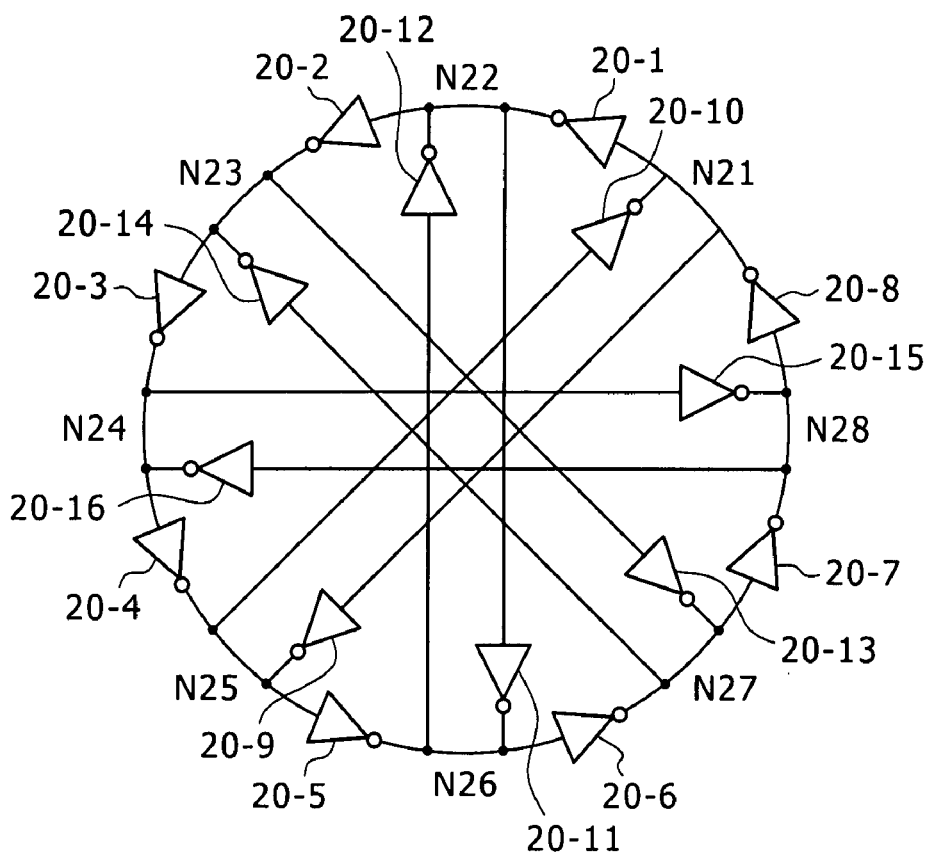
FIG. 12 is a diagram showing an example of configuration of the oscillating circuit shown in FIG. 11.

FIG. 12 is a diagram showing an example of a more detailed configuration of the oscillating circuit shown in FIG. 11.

The oscillating circuit shown in FIG. 12 has eight inverters (20-9 to 20-16) forming four 2-stage auxiliary loop circuits in addition to the eight-stage main loop circuit (20-1 to 20-8) shown in FIG. 9.

The inverters 20-9 and 20-10 form the auxiliary loop circuit connected to the nodes N21 and N25. The input and output of the inverter 20-9 are connected to the nodes N21 and N25, respectively. The input and output of the inverter 20-10 are connected to the nodes N25 and N21, respectively.

The inverters 20-11 and 20-12 form the auxiliary loop circuit connected to the nodes N22 and N26. The input and output of the inverter 20-11 are connected to the nodes N22 and N26, respectively. The input and output of the inverter 20-12 are connected to the nodes N26 and N22, respectively.

The inverters 20-13 and 20-14 form the auxiliary loop circuit connected to the nodes N23 and N27. The input and output of the inverter 20-13 are connected to the nodes N23 and N27, respectively. The input and output of the inverter 20-14 are connected to the nodes N27 and N23, respectively.

The inverters 20-15 and 20-16 form the auxiliary loop circuit connected to the nodes N24 and N28. The input and output of the inverter 20-15 are connected to the nodes N24 and N28, respectively. The input and output of the inverter 20-16 are connected to the nodes N28 and N24, respectively.

Figure 13:
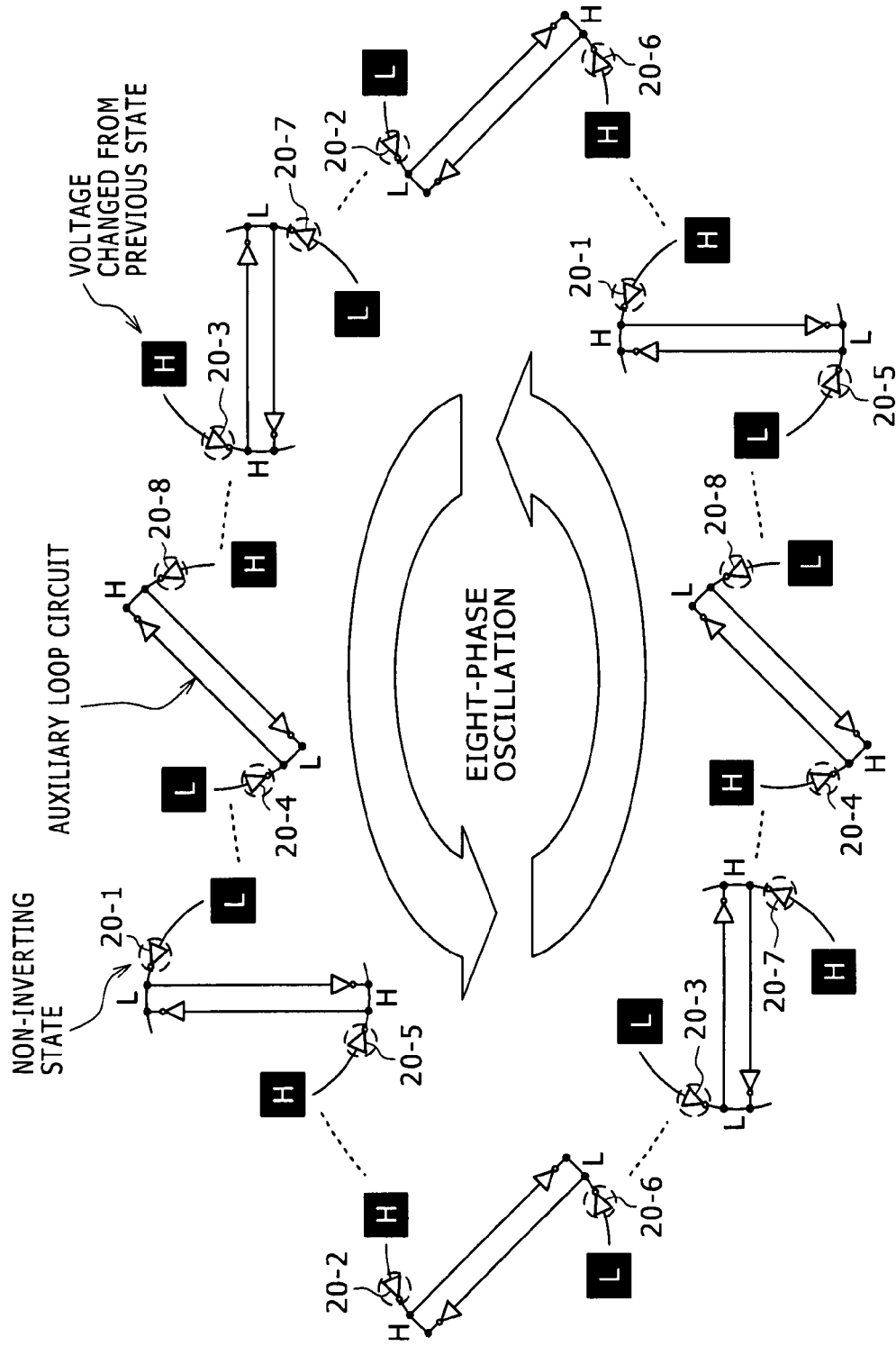
FIG. 13 is a diagram schematically representing the oscillation mechanism of the oscillating circuit shown in FIG. 12.

FIG. 13 is a diagram schematically representing the SL mechanism of the oscillating circuit shown in FIG. 12. As in FIG. 7, a dotted-line circle in FIG. 13 indicates a non-inverting state of an inverter. FIG. 13 shows inverters involved in state transitions of the SL mechanism for simplicity of the figure.

In the example of FIG. 13, when the inverters 20-8 and 20-4 of the main loop circuit are brought into a non-inverting state, the increased driving power of the inverters 20-8 and 20-4 becomes higher than the driving power of the auxiliary loop circuit (20-9 and 20-10), and inverts the logical level of the auxiliary loop circuit (20-9 and 20-10). Then, the inverters 20-1 and 20-5 in a subsequent stage are brought into a non-inverting state, and the increased driving power of the inverters 20-1 and 20-5 inverts the logical level of the auxiliary loop circuit (20-11 and 20-12). Thus, the eight inverters 20-1 to 20-8 of the main loop circuit sequentially make a transition to the non-inverting state, whereby eight-phase oscillation occurs.

Incidentally, as in FIG. 7, analog voltage is schematically represented by logical levels "H" and "L". In addition, a transition to each state has a temporal overlap.

Incidentally, the four auxiliary loop circuits in FIG. 11 and FIG. 12 may be combined with each of the three oscillating circuits shown in FIGS. 10A, 10B, and 10C. Also in this case, the above-described conditions of (1) to (3) are satisfied, and thus oscillation can be produced.

In addition, it is desirable that though not specifically shown, a current source circuit similar to the current source circuit in FIGS. 4A and 4B be provided to the oscillating circuits shown in FIGS. 10A to 12 described above. That is, the power supply input terminals of the respective inverters are connected to a common node, and a sum total of power supply currents supplied to the respective inverters via the node is maintained at a certain value by the current source circuit. It is thereby possible to reduce jitter and phase noise, lower sensitivity to power supply voltage, and extend a frequency adjusting range.

A result of simulation of the oscillating circuit according to the present embodiment will next be shown.

Figure 14:
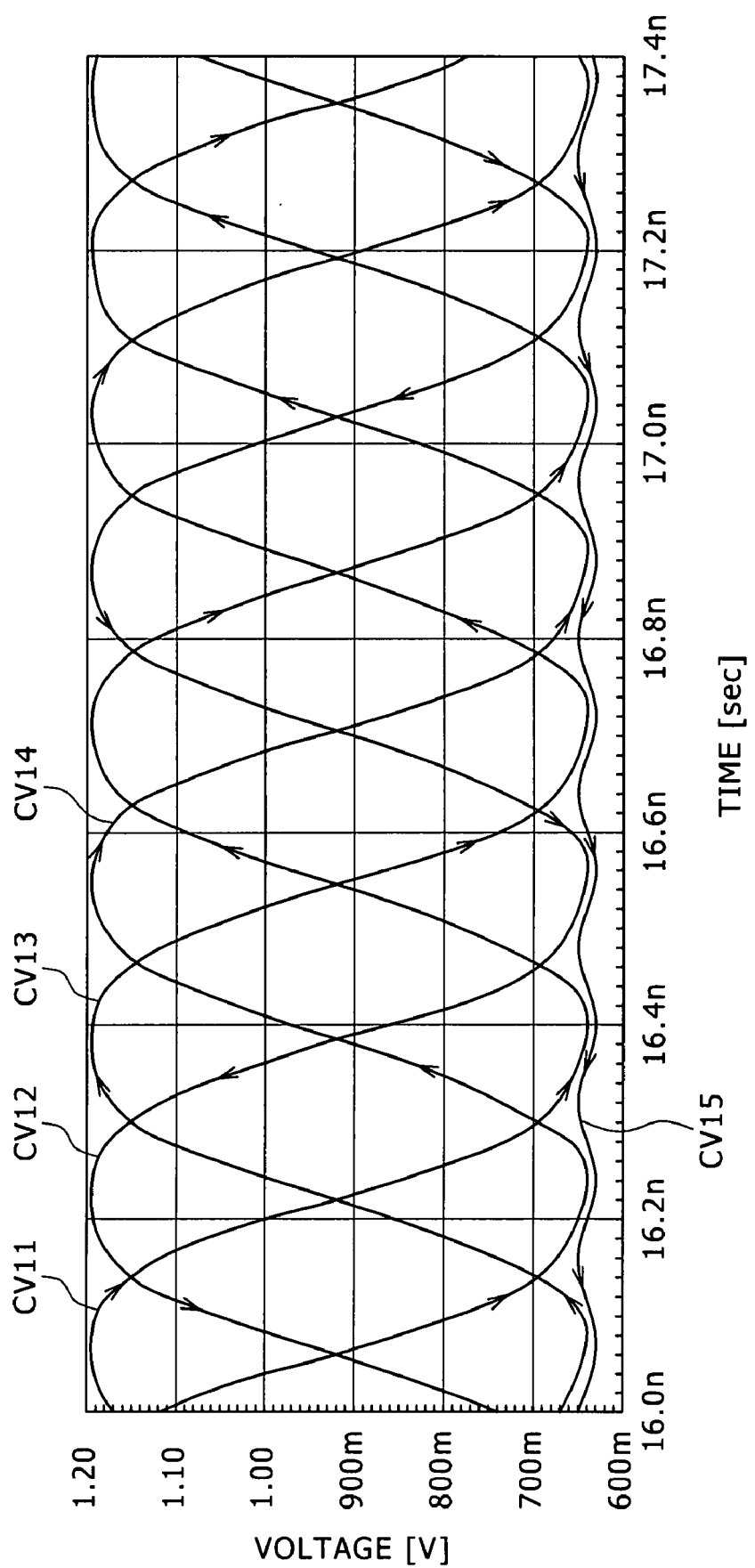
FIG. 14 is a diagram showing the simulation waveforms of four oscillating signals generated in the oscillating circuit shown in FIG. 1.

FIG. 14 is a diagram showing the simulation waveforms of four oscillating signals generated in the oscillating circuit shown in FIG. 1.

In FIG. 14, an axis of ordinates indicates voltage (V), and an axis of abscissas indicates time (nsec). References CV11 to CV14 denote the waveforms of voltages at the nodes N11 to N14, respectively. Reference CV15 denotes the waveform of voltage at the node Nt.

In FIG. 14 showing the simulation waveforms, the voltage of the node Nt slightly oscillates at a frequency four times the oscillation frequency, but is held substantially constant. The phase differences between the nodes N11 to N14 are 90°, and the waveforms of the nodes N11 to N14 are sinusoidal waveforms with little distortion.

Figure 15:
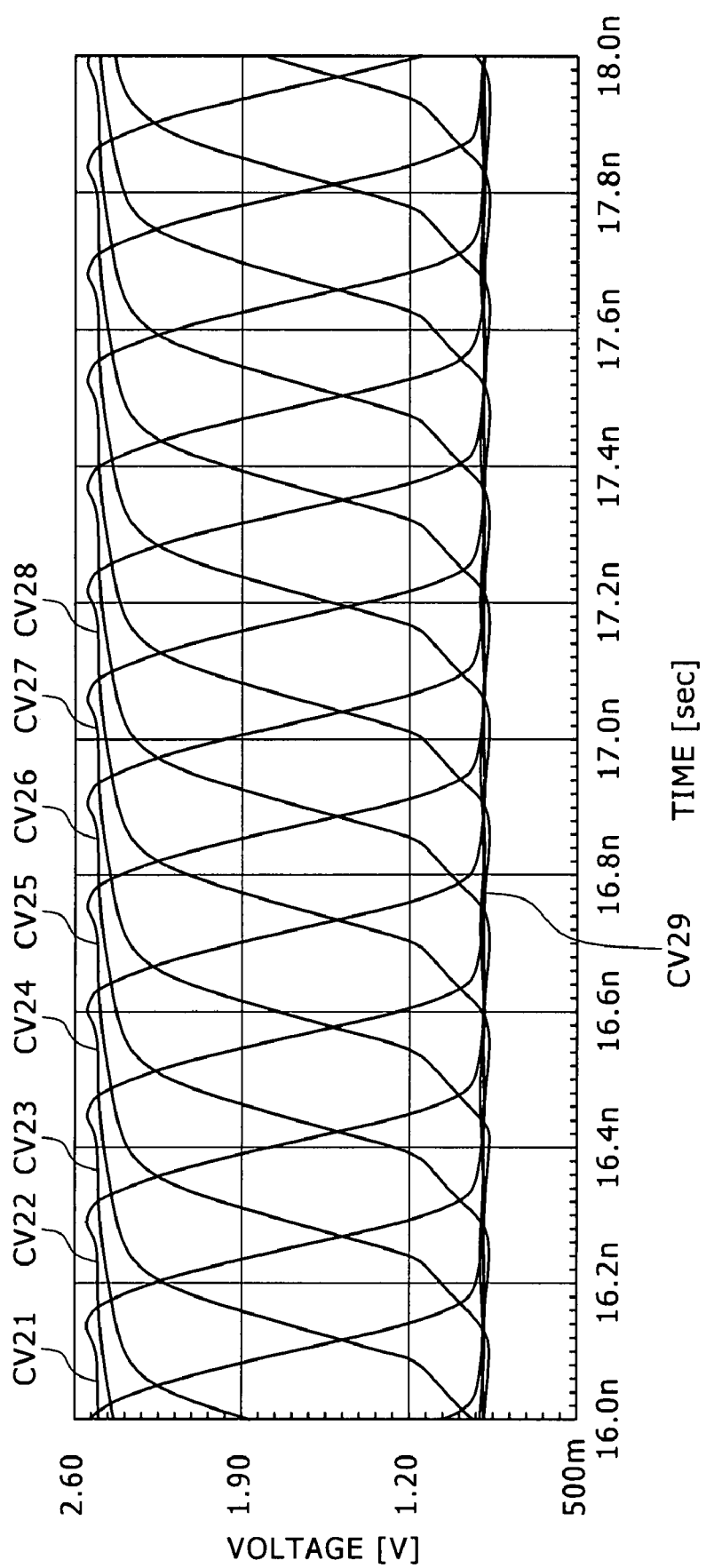
FIG. 15 is a diagram showing the simulation waveforms of eight oscillating signals generated in the oscillating circuit shown in FIG. 12.
Figure 16:
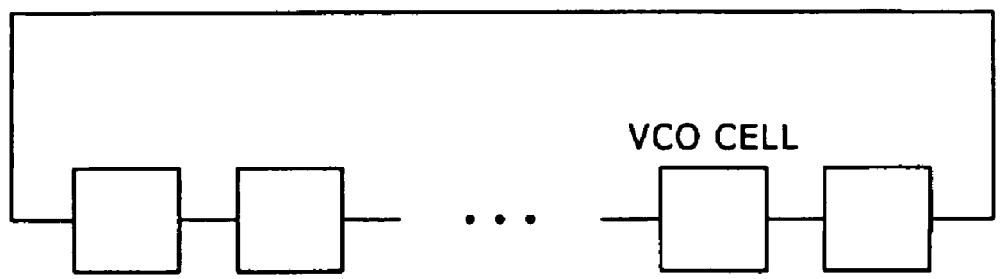
FIG. 16 is a diagram showing an example of configuration of an ordinary ring VCO.
Figure 17:
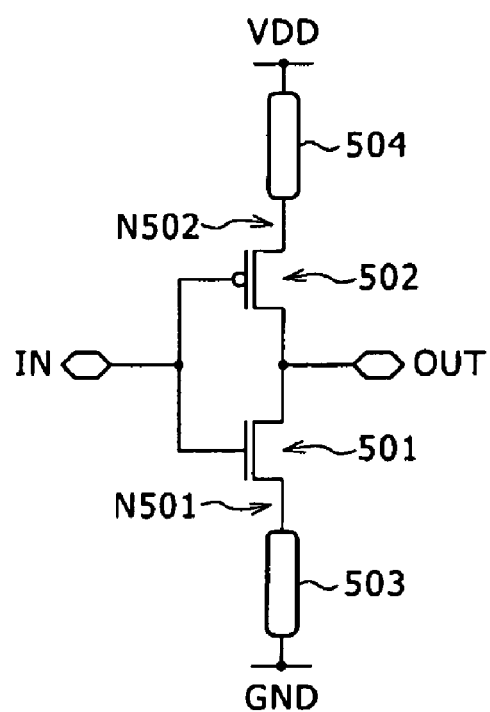
FIG. 17 is a diagram showing an example of configuration of an ordinary single-ended VCO cell.
Figure 18:
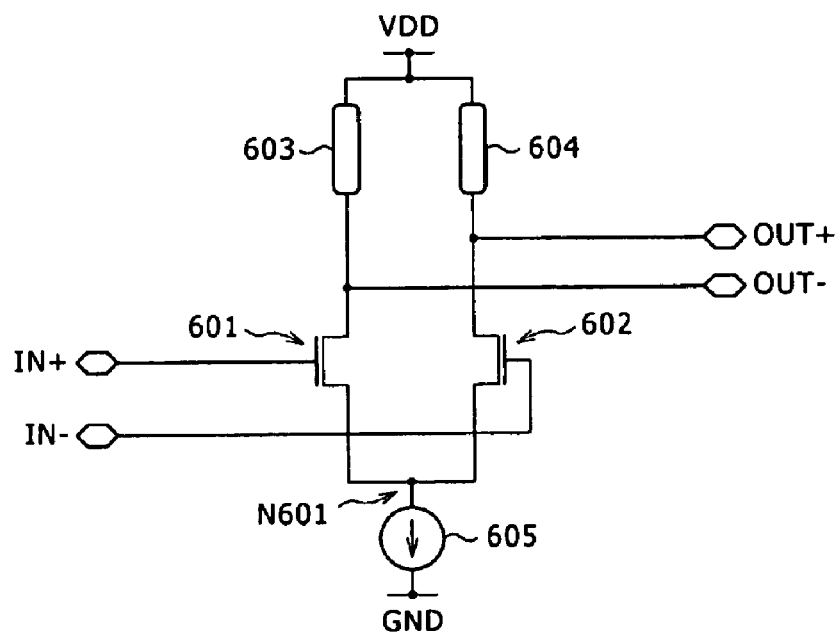
FIG. 18 shows an example of configuration of an ordinary differential VCO cell.
Figure 19:
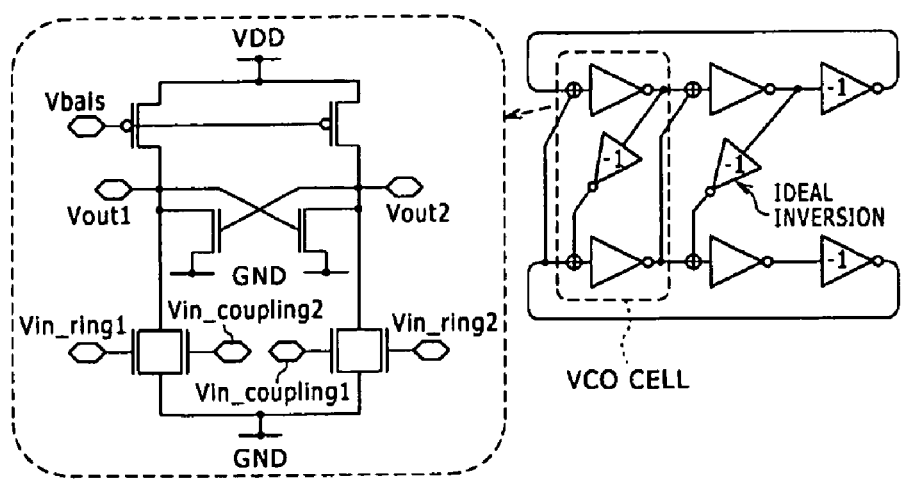
FIG. 19 is a first diagram showing an example of configuration of a VCO in the past.
Figure 20A:
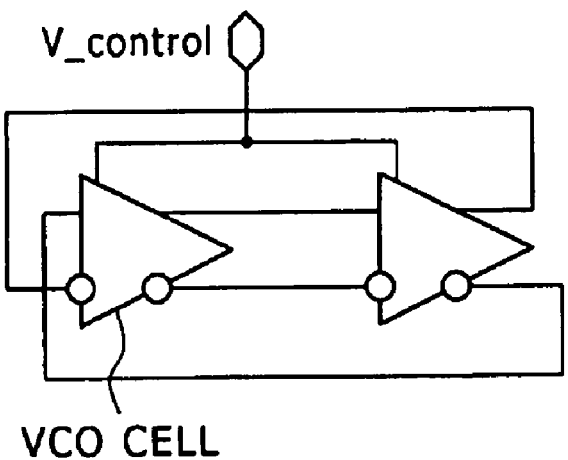
FIGS. 20A and 20B are second diagrams showing an example of configuration of a VCO in the past.
Figure 20B:
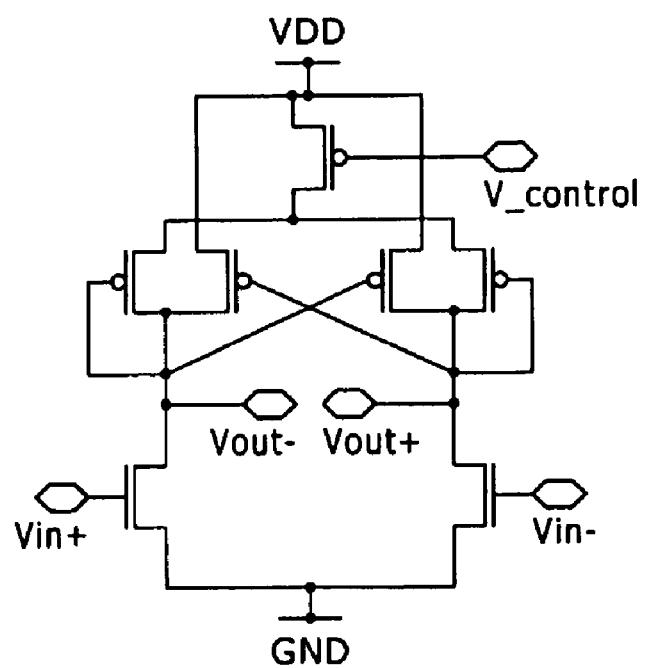
Figure 21:
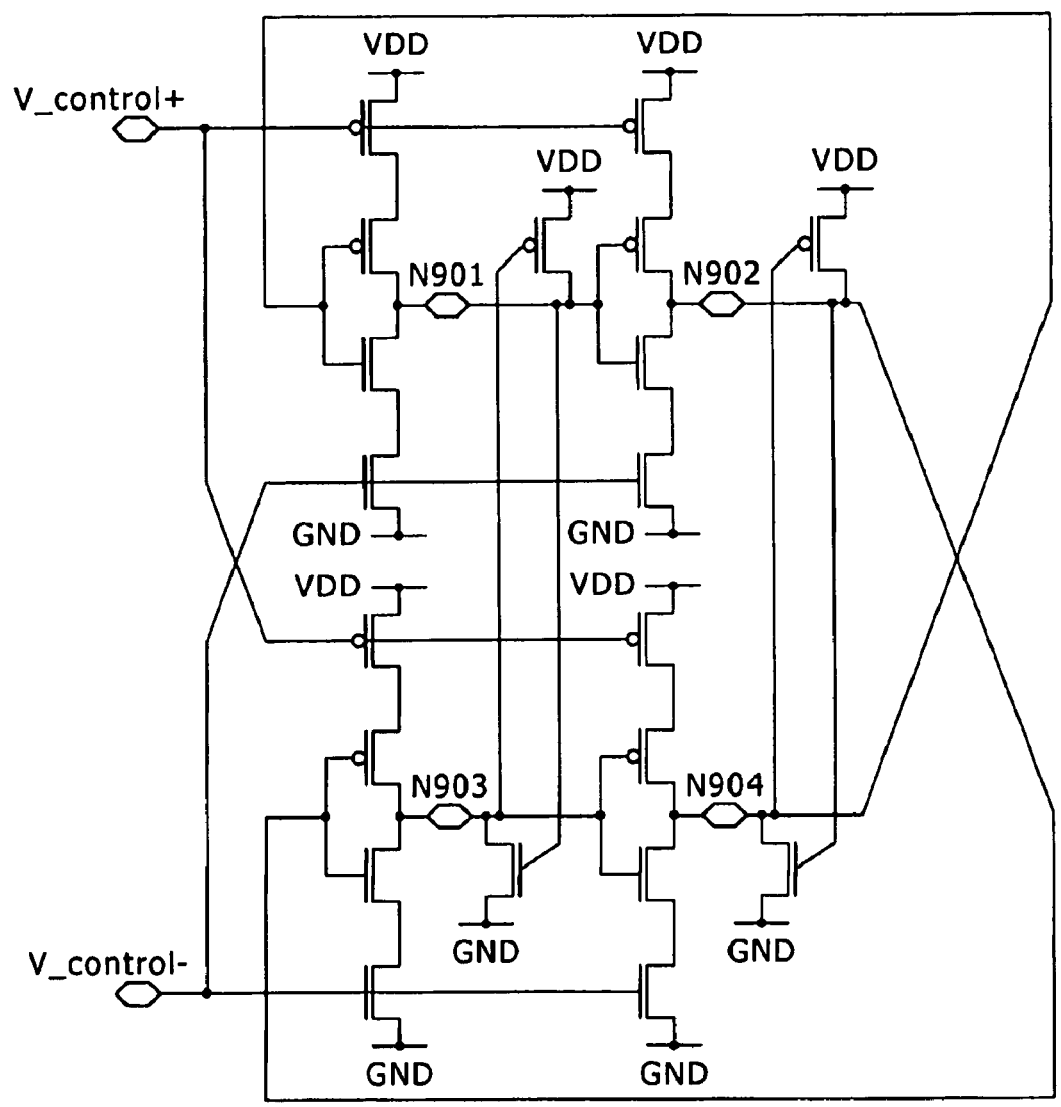
FIG. 21 is a third diagram showing an example of configuration of a VCO in the past.
Figure 23A:
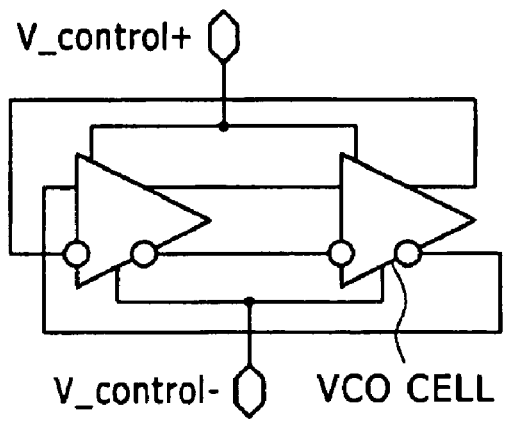
FIGS. 23A and 23B are fifth diagrams showing an example of configuration of a VCO in the past.
Figure 23B:
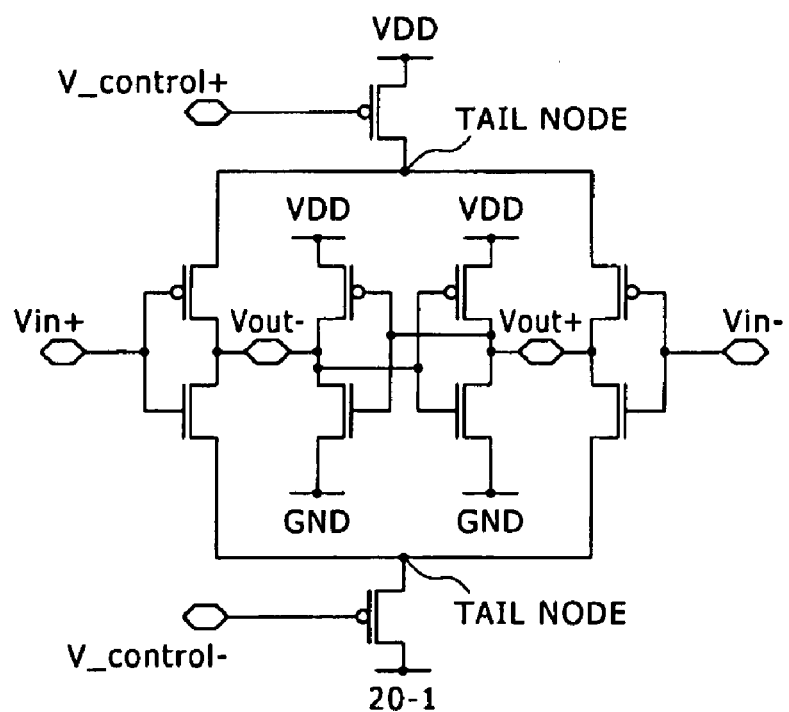

FIG. 15 is a diagram showing the simulation waveforms of eight oscillating signals generated in the oscillating circuit shown in FIG. 12.

In FIG. 15, an axis of ordinates indicates voltage (V), and an axis of abscissas indicates time (nsec). References CV21 to CV28 denote the waveforms of voltages at the nodes N21 to N28, respectively. Reference CV29 denotes the waveform of voltage at the node Nt.

In FIG. 15 showing the simulation waveforms, the voltage of the node Nt is held substantially constant. The phase differences between the nodes N21 to N28 are 45°, and the waveforms of the nodes N21 to N28 are vertically symmetric rectangular waveforms.

While one embodiment of the present invention has been described above, the present invention is not limited to the above embodiment, and includes various variations.

While in the foregoing embodiment, a four-stage main loop circuit and an eight-stage main loop circuit are taken as examples, the present invention is not limited to this, and the main loop circuit may be formed by using even numbers of four or more inverters.

The inverters (inverting circuits) used in the main loop circuit and the auxiliary loop circuits are not limited to the CMOS structure as shown in FIG. 3, and may be other arbitrary inverters having nonlinearity such that the driving power of the inverters is lower when the phases of an output signal and an input signal are inverted with respect to each other than when the output signal and the input signal are in phase with each other. From a viewpoint of reducing jitter and phase noise, however, it is desirable that the inverters have a symmetric structure with respect to a power supply line and a ground line if possible.

The inverters used in the main loop circuit and the auxiliary loop circuits may all have structures equivalent to each other, or a plurality of inverters of different circuit configurations or performances may be combined with each other as long as the symmetry of the above-described circuit topology is maintained.

While the current source circuit is provided on the side of the ground line in the foregoing embodiment, the present invention is not limited to this, and the current source circuit may be provided on the side of the power supply line.

It should be understood by those skilled in the art that various modifications, combinations, sub-combinations and alterations may occur depending on design requirements and other factors insofar as they are within the scope of the appended claims or the equivalents thereof.

What is claimed is:
1. An oscillating circuit comprising:
   N (N denotes even numbers of four or more) nodes configured to output oscillating signals having respective different phases;
   a main loop circuit including N inverting circuits cascaded in a form of a ring via said N nodes: and
   a plurality of auxiliary loop circuits each including even numbers of inverting circuits cascaded in a form of a ring, wherein each inverting circuit in said auxiliary loop circuits is connected in parallel with even numbers of inverting circuits cascaded in said main loop circuit, circuits configured to feed back signals from outputs to inputs of the respective inverters of said main loop circuit have circuit configurations equivalent to each other, and each inverting circuit in said main loop circuit and said auxiliary loop circuits drives an output line such that a phase of an output signal is inverted with respect to a phase of an input signal and has driving power that becomes lower when the phases of the output signal and the input signal are inverted with respect to each other than when the output signal and the input signal are in phase with each other;

a common node to which power supply input terminals of the respective inverting circuits of said main loop circuit and said auxiliary loop circuits are commonly connected; and a current source circuit configured to hold constant a sum total of power supply currents supplied to the respective inverting circuits via said common node.

2. The oscillating circuit as claimed in claim 1,
wherein said current source circuit changes the sum total of said power supply currents according to an input control signal.

3. The oscillating circuit as claimed in claim 1,
wherein each inverting circuit in said main loop circuit and said auxiliary loop circuits has a first transistor of a first conduction type and a second transistor of a second conduction type connected in series with each other, and one terminal of a series circuit of said first transistor and said second transistor is connected to said common node.

4. An oscillating circuit comprising:

N (N denotes even numbers of four or more) nodes configured to output oscillating signals having respective different phases;

a main loop circuit including N inverting circuits cascaded in a form of a ring via said N nodes; and (N/2) auxiliary loop circuits each including two inverting circuits cascaded in a form of a ring via two nodes of said N nodes, wherein each inverting circuit in said auxiliary loop circuits is connected in parallel with (N/2) inverting circuits cascaded in said main loop circuit, said (N/2) auxiliary loop circuits are connected to respective different nodes of said N nodes, and each inverting circuit in said main loop circuit and said auxiliary loop circuits drives an output line such that a phase of an output signal is inverted with respect to a phase of an input signal and has driving power that becomes lower when the phases of the output signal and the input signal are inverted with respect to each other than when the output signal and the input signal are in phase with each other;

a common node to which power supply input terminals of the respective inverting circuits of said main loop circuit and said auxiliary loop circuits are commonly connected; and a current source circuit configured to hold constant a sum total of power supply currents supplied to the respective inverting circuits via said common node.

5. The oscillating circuit as claimed in claim 4,
wherein said current source circuit changes the sum total of said power supply currents according to an input control signal.

6. The oscillating circuit as claimed in claim 4,
wherein each inverting circuit in said main loop circuit and said auxiliary loop circuits has a first transistor of a first conduction type and a second transistor of a second conduction type connected in series with each other, and one terminal of a series circuit of said first transistor and said second transistor is connected to said common node.

* * * * *